United States Patent
Lee et al.

(10) Patent No.: US 9,660,672 B2
(45) Date of Patent: May 23, 2017

(54) METHOD FOR OPERATING ELECTRONIC DEVICE FOR RF SIGNAL TRANSMISSION AND ELECTRONIC DEVICE FOR THE SAME

(71) Applicant: Samsung Electronics Co., Ltd, Gyeonggi-do (KR)

(72) Inventors: Young-Min Lee, Seoul (KR); Jung-Hwan Son, Gyeonggi-do (KR); Yu-Seon Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/236,363

(22) Filed: Aug. 12, 2016

(65) Prior Publication Data

US 2017/0047951 A1  Feb. 16, 2017

(30) Foreign Application Priority Data

Aug. 12, 2015 (KR) .................. 10-2015-0114097

(51) Int. Cl.
| | |
|---|---|
| *H04B 1/04* | (2006.01) |
| *H03C 1/62* | (2006.01) |
| *H04B 17/00* | (2015.01) |
| *H03F 3/195* | (2006.01) |
| *H03F 3/213* | (2006.01) |

(52) U.S. Cl.
CPC ............. *H04B 1/04* (2013.01); *H03F 3/195* (2013.01); *H03F 3/213* (2013.01); *H03F 2200/105* (2013.01); *H03F 2200/451* (2013.01)

(58) Field of Classification Search
CPC . H03C 1/62; H04B 17/00; H04B 1/04; H04B 7/005; H04W 52/226; H03G 3/3042; H03G 3/30; H04Q 7/32; H03F 3/195; H03F 3/213; H03F 2200/105; H03F 220/451

See application file for complete search history.

(56) References Cited

U.S. PATENT DOCUMENTS

| | | | | |
|---|---|---|---|---|
| 6,026,284 | A * | 2/2000 | Seo ...................... | H03G 3/3042 330/284 |
| 6,191,653 | B1 * | 2/2001 | Camp, Jr. ................ | H03C 5/00 330/10 |
| 6,996,381 | B2 * | 2/2006 | Lee ...................... | H03G 3/3036 455/115.1 |
| 7,313,063 | B2 * | 12/2007 | Liu ...................... | G11B 7/1267 369/47.28 |

(Continued)

FOREIGN PATENT DOCUMENTS

KR  10-2003-0029406  4/2003

*Primary Examiner* — Pablo Tran

(57) ABSTRACT

A method for operating an electronic device for transmission of a radio frequency (RF) signal includes selecting output power of a power amplifier (PA) required upon transmission of a signal with a second frequency through an antenna, determining a first PA operation voltage corresponding to the selected output power using first information stored in a memory of the electronic device and second information regarding a PA operation voltage corresponding to first output power of the PA at the second frequency, supplying the determined first PA operation voltage to the PA, and supplying input power corresponding to the selected output power at the second frequency to the PA. Other various embodiments are possible.

20 Claims, 16 Drawing Sheets

(56) References Cited

U.S. PATENT DOCUMENTS

| | | | |
|---|---|---|---|
| 7,684,760 B2 * | 3/2010 | Kwak | ................ H04W 52/226 455/115.1 |
| 2003/0068991 A1 | 4/2003 | Lee | |

* cited by examiner

METHOD FOR OPERATING ELECTRONIC DEVICE FOR RF SIGNAL TRANSMISSION AND ELECTRONIC DEVICE FOR THE SAME

CROSS-REFERENCE TO RELATED APPLICATION(S) AND CLAIM OF PRIORITY

The present application is related to and claims the benefit under 35 U.S.C. §119(a) of a Korean patent application filed in the Korean Intellectual Property Office on Aug. 12, 2015 and assigned Serial No. 10-2005-0114097, the entire disclosure of which is incorporated herein by reference.

TECHNICAL FIELD

The present disclosure relates to methods for operating electronic devices for RF signal transmission and electronic devices for the same.

BACKGROUND

A communication device performing wireless communication includes a radio frequency (RF) power amplifier for boosting up the power of transmit signals and many other integrated circuits (ICs). The RF power amplifier (PA) in the communication device amplifies RF signals and allows the amplified RF signals to be transmitted through an antenna. As such, power amplifiers may be used to amplify relatively low-power RF signals.

Since the power amplifier and RF front end (e.g., a switch or diplexer) are an analog circuit, they exhibit different characteristics per communication device. Thus, different characteristics per analog circuit need to be calibrated to be consistent in order to adjust the characteristics for RF signal transmission. For example, RF power required for RF signal transmission is subjected to calibration for RF signal transmission in such a manner that the gain of the transmitter and the gain of the power amplifier are adjusted and the output power corresponding to the input power is then measured.

In order to optimize the power consumed in the power amplifier for RF signal transmission, the overall output power has been calibrated for each power mode of the power amplifier and the channel (frequency). For example, when the power amplifier supports three power modes, average power tracking (APT) adjustment and calibration need to be carried out for the overall output power per channel for each of the three power modes in order to optimize the power consumed per channel in the power amplifier.

As such, even output power and power modes not requiring calibration are subjected to calibration. Thus, the time of calibration is prolonged. Further, a gain table or input power values are required to be stored in the APT table and results of calibration, which requires an excessive memory size to be secured.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object of the present disclosure to provide a method for operating an electronic device for RF signal transmission and electronic device for the same for addressing the foregoing or other issues.

According to an embodiment of the present disclosure, an electronic device comprises a housing, an antenna included in the housing or formed by a portion of the housing, a power amplifier (PA) electrically connected with the antenna, a radio frequency (RF) transmission circuit electrically connected with the PA, a processor electrically connected with the RF transmission circuit and the PA, and a memory electrically connected with the processor, wherein the memory includes first information regarding a PA operation voltage and input power corresponding to output power of the PA at a first frequency and second information regarding a PA operation voltage corresponding to first output power of the PA at a second frequency different from the first frequency, and wherein the memory stores instructions executed to enable the processor to select output power of the PA required upon transmission of a signal with the second frequency through the antenna, determine a first PA operation voltage corresponding to the selected output power using at least one of the first information and the second information, perform control so that the determined first PA operation voltage is supplied to the PA, and perform control so that input power corresponding to the selected output power at the second frequency is supplied to the PA.

According to an embodiment of the present disclosure, a method for operating an electronic device for transmission of a radio frequency (RF) signal comprises selecting output power of a power amplifier (PA) required upon transmission of a signal with a second frequency through an antenna, determining a first PA operation voltage corresponding to the selected output power using first information stored in a memory of the electronic device and second information regarding a PA operation voltage corresponding to first output power of the PA at the second frequency, supplying the determined first PA operation voltage to the PA, and supplying input power corresponding to the selected output power at the second frequency to the PA, wherein the first information may be information regarding a PA operation voltage and input power corresponding to output power of the PA at a first frequency different from the second frequency.

According to an embodiment of the present disclosure, an electronic device may comprise a power amplifier (PA) amplifying and outputting a radio frequency (RF) signal, a memory including first information regarding a PA operation voltage and input power corresponding to output power of the PA at a first frequency and second information regarding a PA operation voltage corresponding to first output power of the PA at a second frequency different from the first frequency, and a processor determining a first PA operation voltage corresponding to output power selected for transmission of the RF signal using at least one of the first information and the second information, performing control so that the first PA operation voltage is supplied to the PA, and performing control so that input power corresponding to the selected output power is supplied to the PA.

According to an embodiment of the present disclosure, a method for supplying power for transmitting a radio frequency (RF) signal from an electronic device may comprise determining a first PA operation voltage corresponding to selected output power for the RF signal transmission using at least one of first information and second information stored in a memory of the electronic device, supplying the first PA operation voltage to the PA, and supplying input power corresponding to the selected output power to the PA, wherein the first information is information regarding a PA operation voltage and input power corresponding to output power of the PA at a first frequency, and the second information is information regarding a PA operation voltage corresponding to first output power of the PA at a second frequency different from the first frequency.

According to an embodiment of the present disclosure, the electronic device including the power amplifier may perform calibration only on one channel, i.e., one frequency, rather than performing calibration on the overall output power per channel and per power mode. A result of performing calibration on one channel may be used to determine an operation voltage and input power of the power amplifier to supply optimized power even upon signal transmission on other channels.

As such, the calibration only on one frequency may reduce the time of calibration and eliminates the need for unnecessarily storing, e.g., a gain table or input power values in the APT table and results of calibration. Thus, the memory may efficiently be managed.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith." as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components, and structures.

DETAILED DESCRIPTION

Figure 1:
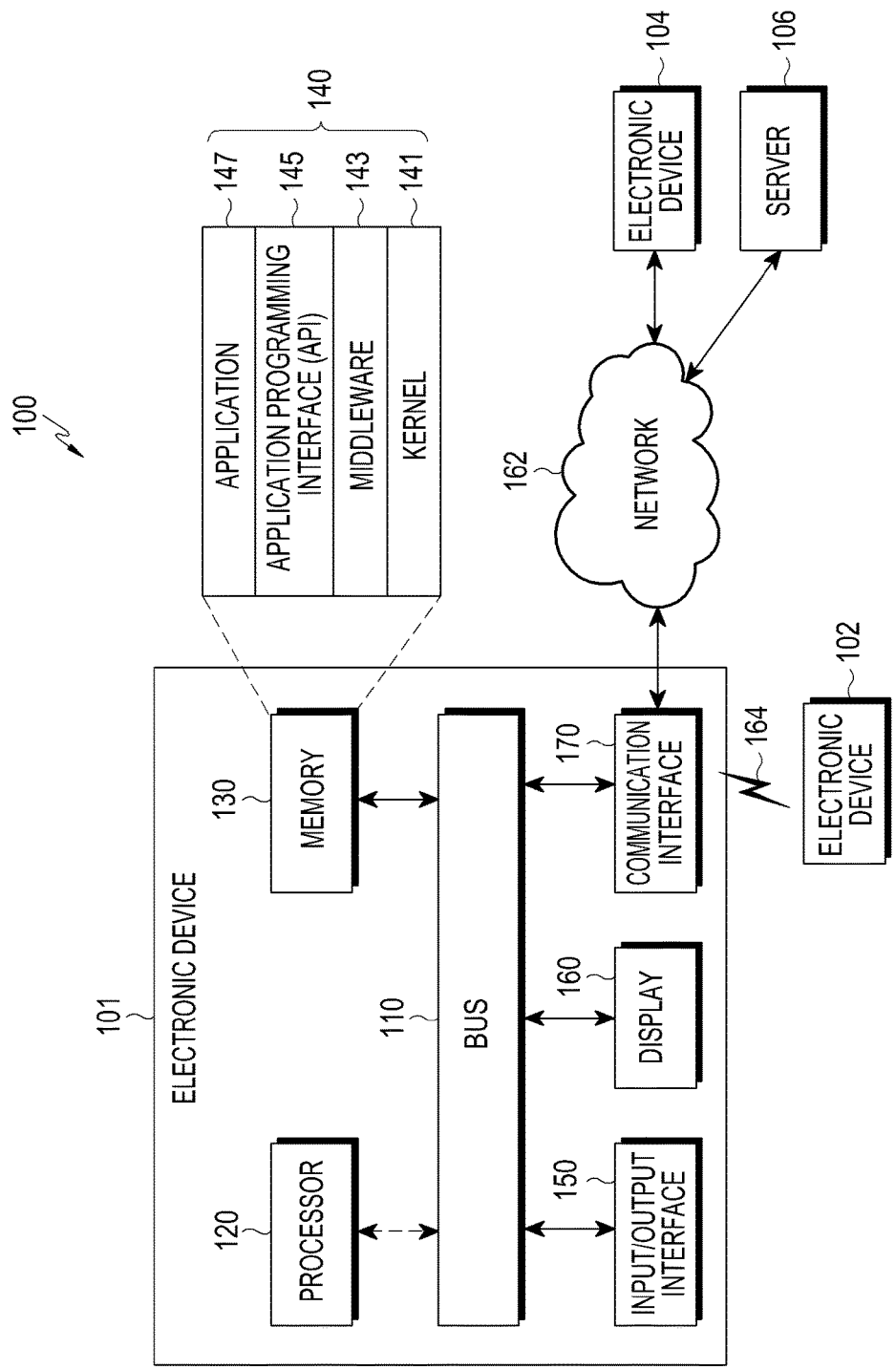
FIG. 1 illustrates a network environment including an electronic device according to an embodiment of the present disclosure.

FIGS. 1 through 17, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Hereinafter, embodiments of the present disclosure are described with reference to the accompanying drawings. However, it should be appreciated that the present disclosure is not limited to the embodiments, and all changes and/or equivalents or replacements thereto also belong to the scope of the present disclosure. The same or similar reference denotations may be used to refer to the same or similar elements throughout the specification and the drawings.

As used herein, the terms "have," "may have," "include," or "may include" a feature (e.g., a number, function, operation, or a component such as a part) indicate the existence of the feature and do not exclude the existence of other features.

As used herein, the terms "A or B," "at least one of A and/or B," or "one or more of A and/or B" may include all possible combinations of A and B. For example, "A or B," "at least one of A and B," "at least one of A or B" may indicate all of (1) including at least one A, (2) including at least one B, or (3) including at least one A and at least one B.

As used herein, the terms "first" and "second" may modify various components regardless of importance and/or order and are used to distinguish a component from another without limiting the components. For example, a first user device and a second user device may indicate different user devices from each other regardless of the order or importance of the devices. For example, a first component may be denoted a second component, and vice versa without departing from the scope of the present disclosure.

It will be understood that when an element (e.g., a first element) is referred to as being (operatively or communicatively) "coupled with/to," or "connected with/to" another element (e.g., a second element), it can be coupled or connected with/to the other element directly or via a third element. In contrast, it will be understood that when an element (e.g., a first element) is referred to as being "directly coupled with/to" or "directly connected with/to" another element (e.g., a second element), no other element (e.g., a third element) intervenes between the element and the other element.

As used herein, the terms "configured (or set) to" may be interchangeably used with the terms "suitable for," "having the capacity to," "designed to," "adapted to," "made to," or "capable of" depending on circumstances. The term "configured (or set) to" does not essentially mean "specifically designed in hardware to." Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

The terms as used herein are provided merely to describe some embodiments thereof, but not to limit the scope of other embodiments of the present disclosure. It is to be understood that the singular forms "a," "an," and "the" include plural references unless the context clearly dictates otherwise. The terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a personal digital assistant (PDA), a portable multimedia player (PMP), an MP3 player, a mobile medical device, a camera, or a wearable device. According to an embodiment of the present disclosure, the wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device (e.g., an implantable circuit). According to an embodiment of the present disclosure, the electronic device may be a home appliance. Examples of the home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame.

According to an embodiment of the present disclosure, examples of the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, automatic teller's machines (ATMs), point of sales (POS) devices, or Internet of Things devices (e.g., a bulb, various sensors, an electric or gas meter, a sprinkler, a fire alarm, a thermostat, a street light, a toaster, fitness equipment, a hot water tank, a heater, or a boiler).

According to various embodiments of the disclosure, examples of the electronic device may at least one of part of a piece of furniture or building/structure, an electronic board, an electronic signature receiving device, a projector, or various measurement devices (e.g., devices for measuring water, electricity, gas, or electromagnetic waves). According to an embodiment of the present disclosure, the electronic device may be one or a combination of the above-listed devices. According to an embodiment of the present disclosure, the electronic device may be a flexible electronic device. The electronic device disclosed herein is not limited to the above-listed devices, and may include new electronic devices depending on the development of technology.

Hereinafter, electronic devices are described with reference to the accompanying drawings, according to various embodiments of the present disclosure. As used herein, the term "user" may denote a human or another device (e.g., an artificial intelligent electronic device) using the electronic device.

Referring to FIG. 1, according to an embodiment of the present disclosure, an electronic device 101 is included in a network environment 100. The electronic device 101 may include a bus 110, a processor 120, a memory 130, an input/output interface 150, a display 160, and a communication interface 170. In some embodiments, the electronic device 101 may exclude at least one of the components or may add another component.

The bus 110 may include a circuit for connecting the components 110 to 170 with one another and transferring communications (e.g., control messages and/or data) between the components.

The processor 120 may include one or more of a central processing unit (CPU), an application processor (AP), or a communication processor (CP). The processor 120 may perform control on at least one of the other components of the electronic device 101, and/or perform an operation or data processing relating to communication.

The memory 130 may include a volatile and/or non-volatile memory. For example, the memory 130 may store commands or data related to at least one other component of the electronic device 101. According to an embodiment of the present disclosure, the memory 130 may store software and/or a program 140. The program 140 may include, e.g., a kernel 141, middleware 143, an application programming interface (API) 145, and/or an application program (or "application") 147. At least a portion of the kernel 141, middleware 143, or API 145 may be denoted an operating system (OS).

For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example.

Further, the middleware 143 may process one or more task requests received from the application program 147 in order of priority. For example, the middleware 143 may assign at least one of application programs 147 with priority of using system resources (e.g., the bus 110, processor 120, or memory 130) of at least one electronic device 101. For example, the middleware 143 may perform scheduling or load balancing on the one or more task requests by processing the one or more task requests according to the priority assigned to the at least one application program 147.

The API 145 is an interface allowing the application 147 to control functions provided from the kernel 141 or the middleware 143. For example, the API 145 may include at least one interface or function (e.g., a command) for filing control, window control, image processing or text control.

The input/output interface 150 may serve as an interface that may, e.g., transfer commands or data input from a user or other external devices to other component(s) of the electronic device 101. Further, the input/output interface 150 may output commands or data received from other component(s) of the electronic device 101 to the user or the other external device.

The display 160 may include, e.g., a liquid crystal display (LCD), a light emitting diode (LED) display, an organic light emitting diode (OLED) display, or a microelectromechanical systems (MEMS) display, or an electronic paper display. The display 160 may display, e.g., various contents (e.g., text, images, videos, icons, or symbols) to the user. The display 160 may include a touchscreen and may receive, e.g., a touch, gesture, proximity or hovering input using an electronic pen or a body portion of the user.

For example, the communication interface 170 may set up communication between the electronic device 101 and an external electronic device (e.g., a first electronic device 102, a second electronic device 104, or a server 106). For example, the communication interface 170 may be connected with the network 162 through wireless or wired communication to communicate with the external electronic device.

The wireless communication may be a cellular communication protocol and may use at least one of, e.g., long-term evolution (LTE), LTE-advanced (LTE-A), code division multiple access (CDMA), wideband CDMA (WCDMA), universal mobile telecommunications system (UMTS), wireless broadband (WiBro), or global system for mobile communications (GSM). Further, the wireless communication may include, e.g., wireless communication 164. The wireless communication 164 may include at least one of wireless fidelity (Wi-Fi), Bluetooth, near-field communication (NFC), or global navigation satellite system (GNSS). The GNSS may include at least one of, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, or plain old telephone service (POTS). The network 162 may include at least one of communication networks, e.g., a computer network (e.g., local area network (LAN) or wide area network (WAN)), Internet, or a telephone network.

The first and second external electronic devices 102 and 104 each may be a device of the same or a different type from the electronic device 101. According to an embodiment of the present disclosure, the server 106 may include a group of one or more servers. According to an embodiment of the present disclosure, all or some of operations executed on the electronic device 101 may be executed on another or multiple other electronic devices (e.g., the electronic devices 102 and 104 or server 106). According to an embodiment of the present disclosure, when the electronic device 101 should perform some function or service automatically or at a request, the electronic device 101, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

The processor 120 may process at least part of information obtained from other elements (e.g., at least one of the memory 130, the input/output interface 150, or the communication interface 170) and may use the same in various manners. For example, the processor 120 may control at least some functions of the electronic device 101 so that the electronic device 101 may interwork with another electronic device (e.g., the electronic device 102 or 104 or the server 106). The processor 120 may be integrated with the communication interface 170. According to an embodiment of the present disclosure, at least one configuration of the processor 120 may be included in the server 106 and may be supported for at least one operation implemented on the processor 120 from the server 106.

According to an embodiment of the present disclosure, the memory 130 may include instructions enabling the processor 120 to operate. For example, the memory 130 may include instructions enabling the processor 120 to control other components of the electronic device 101 and to interwork with other electronic devices 102 and 104 or the server 106. The processor 120 may control other components of the electronic device 101 and interwork with the other electronic devices 102 and 104 or the server 106 based on the instructions stored in the memory 130. Hereinafter, operations of the electronic device 101 are described based on each component of the electronic device 101. The instructions enabling the components to operate may be included in the memory 130.

The above-described other components (e.g., the bus 110, processor 120, memory 130, input/output interface 150, display 160, and communication interface 170) may be included in the housing of the electronic device 101. Further, although not shown, an antenna for RF signal communication may be included in the housing or may be formed by a portion of the housing.

According to an embodiment of the present disclosure, the electronic device 101 may include a power amplifier (PA) amplifying and outputting the power of RF signals for RF signal transmission. Hereinafter, input power may refer to the input power of a RF signal input to the PA, and output power may refer to the output power of a RF signal output from the PA.

According to an embodiment of the present disclosure, the electronic device 101 may include a radio frequency (RF) transmission circuit converting RF signals generated in the processor 120 into RF signals. For example, the RF transmission circuit may receive signals generated from a communication processor (CP), up-modulate the received signals into RF signals, and transmit the RF signals to the PA.

According to an embodiment of the present disclosure, the memory 130 may include information regarding the control of the PA. The information regarding the control of the PA may be generated based on a result of the calibration on the PA. The PA control-related information may be generated based on a result of performing calibration at a frequency corresponding to a first channel among a plurality of communication channels available in the communication interface 170.

For example, the memory 130 may include first information regarding a PA operation voltage and input power corresponding to an output power of the PA at the first frequency. The first information may adjust the index of the input power so that the input power at the first frequency may be varied and calibrated by a preset size or level and may then correspond to the output power of the PA. Further, a PA operation voltage may be set allowing the power consumed in the PA to be optimized corresponding to the output power of the PA. The first information regarding the PA operation voltage and input power corresponding to the output power of the PA may be generated through such process and may be stored in the memory 130.

According to an embodiment of the present disclosure, without performing calibration at the frequencies respectively corresponding to the plurality of communication channels available in the communication interface 170, a result of performing calibration at the first frequency may be used to determine the PA operation voltage and input power corresponding to the output power for RF signal transmission at other frequencies than the first frequency.

To that end, the memory 130 may include second information regarding a PA operation voltage corresponding to the first output power of the PA at a second frequency different from the first frequency. Described below is a method for determining a PA operation voltage and input power at the second frequency different from the first frequency using a result of performing calibration at the first frequency. However, this is merely for illustration purposes, the present disclosure is not limited thereto, and the second frequency may be all other frequencies than the first frequency.

Calibration may also be conducted at the second frequency corresponding to a particular first output power level among all output power levels outputtable from the PA, and the second information regarding the PA operation voltage corresponding to the first output power may be generated. The second information may be generated as the PA operation voltage itself corresponding to the first output power at the second frequency or may be generated as a PA operation voltage adjusted with respect to the PA operation voltage corresponding to the first output power of the first information.

According to an embodiment of the present disclosure, the processor 120 may select the output power of the PA required upon RF signal transmission through the antenna. The processor 120 may select the output power of the PA based on the characteristics of the network connected with the electronic device 101. For example, the processor 120 may receive information, such as power or channel required to transmit RF signals, from a base station or external electronic device (e.g., the electronic device 102) connectable with the electronic device 101 and may select the output power of the PA based on information necessary for the RF signal transmission.

According to an embodiment of the present disclosure, the processor 120 may determine the first PA operation voltage corresponding to the selected output power using at least one of the first information and the second information. The processor 120 may perform control so that the determined first PA operation voltage is supplied to the PA. Accordingly, the processor 120 may adjust the PA operation voltage to supply the power optimized for the PA to output the selected output power.

According to an embodiment of the present disclosure, when the frequency for RF signal transmission is the first frequency, the processor 120 may determine that the first PA operation voltage is the PA operation voltage corresponding to the selected output power included in the first information. As described above, since calibration is performed at the first frequency for all power levels outputtable from the PA, the input power may be determined using the first information for the result of the calibration. As such, since it is determined according to the frequency used upon RF signal transmission whether the first information stored in the memory 130 may be used as it is, a process for identifying the frequency used upon RF signal transmission may be performed prior to determining the first PA operation voltage.

According to an embodiment of the present disclosure, the processor 120 may determine whether the selected output power belongs to a preset range of output power. When the frequency for the RF signal transmission is the second frequency, the processor 120 may determine whether the selected output power belongs to the preset output power range. As described above, since calibration is performed at the second frequency only for a particular output power level, an input power level corresponding to an output power level selected in a scheme different form the first frequency may be determined.

When the selected output power belongs to the preset output power range, the processor 120 may determine the first PA operation voltage corresponding to the selected output power using at least one of the first information and the second information.

For the output power included in the preset output power range, the input power corresponding to the selected output power may be determined using at least one of the first information and the second information.

Even when the selected output power does not belong to the preset output power range, the input power corresponding to the selected output power may be determined based on at least one of the first information and the second information. The preset output power range may be set based on the characteristics of the PA and a plurality of power modes of the PA.

According to an embodiment of the present disclosure, when the selected output power is the same as the first output power, the processor 120 may determine the PA operation voltage corresponding to the first output power included in the second information as the first PA operation voltage. As described above, calibration may also be performed at the second frequency for the first output power, and the second information may be generated based on the calibration. Thus, when the selected output power is the same as the first output power, the processor 120 may determine the first PA operation voltage using the second information including a result of the calibration.

According to an embodiment of the present disclosure, when the selected output power is different from the first output power, the processor 120 may compute a PA operation voltage corresponding to the selected output power included in the first information and a PA operation voltage corresponding to the selected output power using the second information. The processor 120 may determine the computed PA operation voltage as the first operation voltage corresponding to the selected output power.

When the selected output power is different from the first output power, the processor 120 may not use the result of calibration as it is and may compute the PA operation voltage corresponding to the selected output power using the result of the calibration. The processor 120 may compute the PA operation voltage using the characteristic that although the PA operation voltage corresponding to each PA output power level but the difference between the PA operation voltages respectively corresponding to the frequencies per output power of the PA is the same or similar.

For example, the processor 120 may compare the selected output power with the first output power and may compute the PA operation voltage in different manners depending on comparison results. According to a general PA characteristic, a relatively high PA operation voltage may apply to a high power level, and a relatively low PA operation voltage may apply to a low power level. Thus, when the PA operation voltage is calculated with respect to the first output power that has undergone the calibration, more specifically, in order to more exactly compute the PA operation voltage, the PA operation voltage may be computed in different ways depending on the comparison results.

For example, when the selected output power is larger than the first power level, the processor 120 may compute the PA operation voltage using a preset first constant, and when the selected output power is smaller than the first power level, the processor 120 may compute the PA operation voltage using a preset second constant. A higher compensation may be required to reflect the PA characteristic for higher output power relative to the first output power, and a lower compensation may be required to reflect the PA characteristic for lower output power relative to the first output power. Accordingly, different constants may be applied which represent compensations with respect to the first output power. The first constant and the second constant may be previously set when performing calibration based on the PA characteristic.

Further, a scheme for computing the PA operation voltage, e.g., an equation for computing the PA operation voltage using at least one of the first information and the second information, may be stored in the memory 130. Thus, data or codes stored in the memory 130 may be simplified without the need of storing all the results of performing calibration per frequency. A specific method and equation for computing the PA operation voltage are described below.

According to an embodiment of the present disclosure, the processor 120 may identify a first power mode corresponding to the selected output power among a plurality of power modes of the PA as set based on the PA characteristic.

The PA may operate at one of the plurality of power modes according to the output power of the PA required upon RF signal transmission. At least one or more output power levels may correspond to each of the plurality of power modes depending on the PA characteristic. The processor 120 may select output power required upon RF signal transmission and may identify a power mode corresponding to the selected output power among the plurality of power modes. The processor 120 may perform control so that the PA may operate in the identified power mode.

The memory 130 may store the first information and the second information per power mode. Since information on the variation rate between input power and output power differs per power mode, the first information and the second information may also differ per power mode. Accordingly, the memory 130 may store the first information and the second information per power mode.

The processor 120 may determine the first PA operation voltage corresponding to the selected output power using at least one of the first information and the second information corresponding to the identified first power mode. As described above, since the first information and the second information are different per power mode, the processor 120, after identifying the first power mode corresponding to the selected output power, may determine the first PA operation voltage using at least one of the first information and second information corresponding to the first power mode.

According to an embodiment of the present disclosure, the processor 120 may perform control so that the input power corresponding to the selected output power at the second frequency may be supplied to the PA. The processor 120 may determine the input power using the difference for the input power corresponding to the same output power at the first frequency and second frequency.

The memory 130 may further store the third information regarding the input power corresponding to the second output power of the PA adjusted based on the first information at the second frequency. The third information may also be stored per power mode of the PA similarly to the first information and second information. The first output power and the second output power may be the same or differ from each other.

The third information may be used to determine the input power corresponding to the output power at the second frequency that has not undergone calibration. The third information may be used to adjust an error for the input power corresponding to the same output power between frequencies.

For example, the processor 120 may obtain the third information by comparing the input power at the second frequency corresponding to particular second output power of the PA with the input power at the first frequency included in the first information. The processor 120 may determine the input power corresponding to output power different from the second output power at the second frequency using the third information.

According to an embodiment of the present disclosure, an electronic device comprises a housing, an antenna included in the housing or formed by a portion of the housing, a power amplifier (PA) electrically connected with the antenna, a radio frequency (RF) transmission circuit electrically connected with the PA, a processor electrically connected with the RF transmission circuit and the PA, and a memory electrically connected with the processor, wherein the memory may include first information regarding a PA operation voltage and input power corresponding to output power of the PA at a first frequency and second information regarding a PA operation voltage corresponding to first output power of the PA at a second frequency different from the first frequency, and wherein the memory may store instructions executed to enable the processor to select output power of the PA required upon transmission of a signal with the second frequency through the antenna, determine a first PA operation voltage corresponding to the selected output power of the PA using at least one of the first information and the second information, perform control so that the determined first PA operation voltage is supplied to the PA, and perform control so that input power corresponding to the selected output power of the PA at the second frequency is supplied to the PA.

According to an embodiment of the present disclosure, the memory may store instructions enabling the processor to determine whether the selected output power of the PA belongs to a preset output power range, and when the selected output power of the PA belongs to the preset output power range, determine the first PA operation voltage corresponding to the selected output power of the PA using the second information.

According to an embodiment of the present disclosure, the memory may store instructions enabling the processor to, when the selected output power of the PA is substantially the same as the first output power, determine that a PA operation voltage corresponding to the first output power included in the second information is the first PA operation voltage.

According to an embodiment of the present disclosure, the memory may store instructions enabling the processor to, when the selected output power is different from the first output power, compute a PA operation voltage corresponding to the selected output power included in the first information and a PA operation voltage corresponding to the selected output power using the second information and determine that the computed PA operation voltage is the first PA operation voltage.

According to an embodiment of the present disclosure, the memory may store instructions enabling the processor to compute the PA operation voltage using a preset first constant (F1) when the selected output power is larger than the first output power.

According to an embodiment of the present disclosure, the memory may store instructions enabling the processor to compute the PA operation voltage using a preset second constant (F2) when the selected output power is smaller than the first output power.

According to an embodiment of the present disclosure, the memory may store the first information and the second information for each of a plurality of power modes based on a characteristic of the PA.

According to an embodiment of the present disclosure, the memory may store instructions enabling the processor to identify a first power mode corresponding to the selected output power among the plurality of power modes and determine the first PA operation voltage corresponding to the selected output power using at least one of the first information and the second information corresponding to the first power mode.

According to an embodiment of the present disclosure, the memory may further include third information regarding input power corresponding to second output power of the PA adjusted based on the first information at the second frequency.

According to an embodiment of the present disclosure, the memory may store instructions enabling the processor to perform control so that input power corresponding to the selected output power determined using the third information is supplied to the PA.

Figure 2:
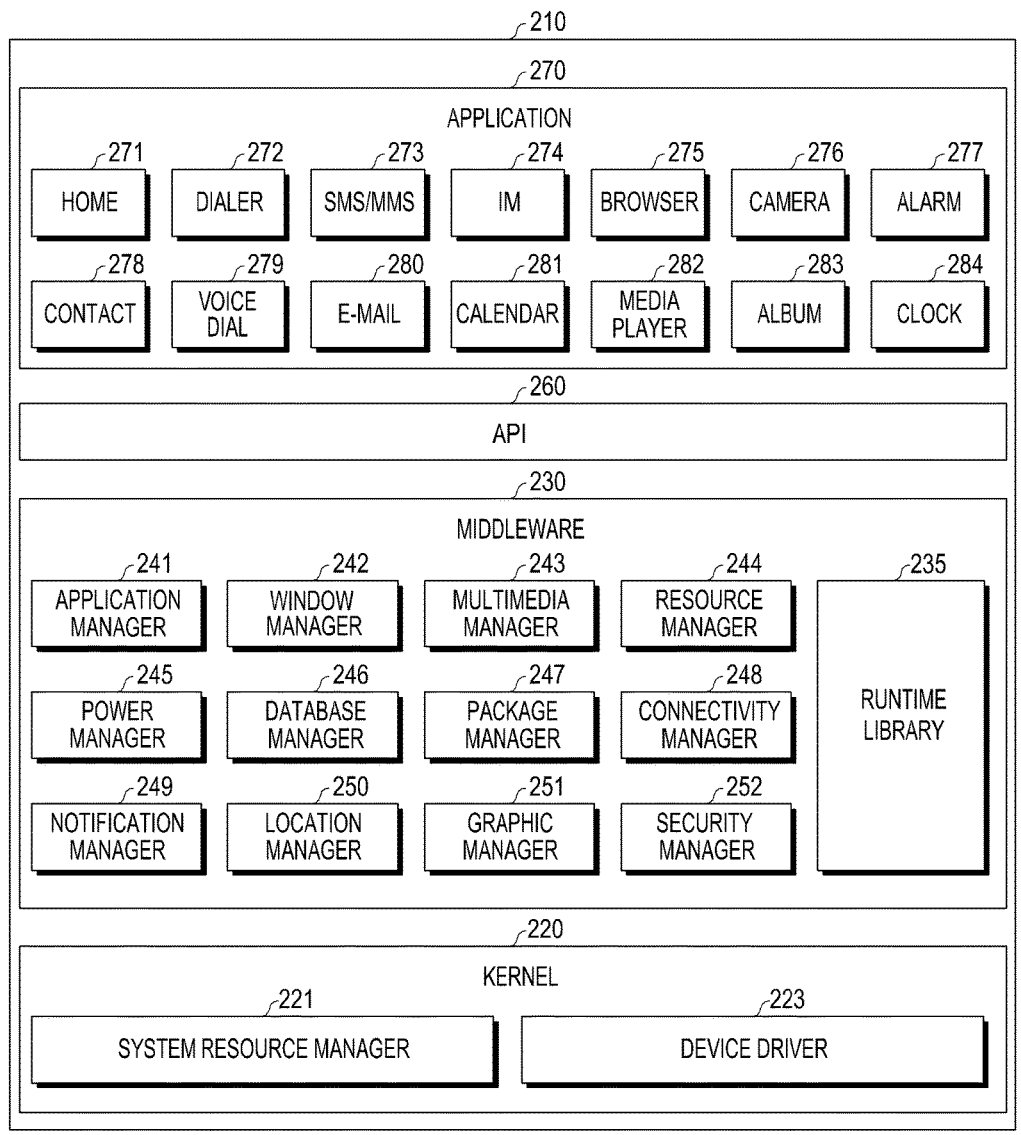
FIG. 2 illustrates a program module according to an embodiment of the present disclosure.

FIG. 2 illustrates a program module according to an embodiment of the present disclosure. According to an embodiment of the present disclosure, the program module 210 (e.g., the program 140) may include an operating system (OS) controlling resources related to the electronic device (e.g., the electronic device 101) and/or various applications (e.g., the application programs 147) driven on the operating system. The operating system may include, e.g., Android, iOS, Windows, Symbian, Tizen, or Bada.

The program module 210 may include, e.g., a kernel 220, middleware 230, an application programming interface (API) 260, and/or an application 270. At least a part of the program module 210 may be preloaded on the electronic device or may be downloaded from an external electronic device (e.g., the electronic devices 102 and 104 or server 106).

The kernel 220 (e.g., the kernel 141) may include, e.g., a system resource manager 221 and/or a device driver 223. The system resource manager 221 may perform control, allocation, or recovery of system resources. According to an embodiment of the present disclosure, the system resource manager 221 may include a process managing unit, a memory managing unit, or a file system managing unit. The device driver 223 may include, e.g., a display driver, a camera driver, a Bluetooth driver, a shared memory driver, a USB driver, a keypad driver, a Wi-Fi driver, an audio driver, or an inter-process communication (IPC) driver.

The middleware 230 may provide various functions to the application 270 through the API 260 so that the application 270 may efficiently use limited system resources in the electronic device or provide functions jointly required by applications 270. According to an embodiment of the present disclosure, the middleware 230 (e.g., the middleware 143) may include at least one of a runtime library 235, an application manager 241, a window manager 242, a multimedia manager 243, a resource manager 244, a power manager 245, a database manager 246, a package manager 247, a connectivity manager 248, a notification manager 249, a location manager 250, a graphic manager 251, or a security manager 252.

The runtime library 235 may include a library module used by a compiler in order to add a new function through a programming language while, e.g., the application 270 is being executed. The runtime library 235 may perform input/output management, memory management, or operation on arithmetic functions.

The application manager 241 may manage the life cycle of at least one application of, e.g., the applications 270. The window manager 242 may manage GUI resources used on the screen. The multimedia manager 243 may grasp formats necessary to play various media files and use a codec appropriate for a format to perform encoding or decoding on media files. The resource manager 244 may manage resources, such as source code of at least one of the applications 270, memory or storage space.

The power manager 245 may operate together with, e.g., a basic input/output system (BIOS) to manage battery or power and provide power information necessary for operating the electronic device. The database manager 246 may generate, search, or vary a database to be used in at least one of the applications 270. The package manager 247 may manage installation or update of an application that is distributed in the form of a package file.

The connectivity manager 248 may manage wireless connectivity, such as, e.g., Wi-Fi or Bluetooth. The notification manager 249 may display or notify an event, such as a coming message, appointment, or proximity notification, of the user without interfering with the user. The location manager 250 may manage locational information on the electronic device. The graphic manager 251 may manage graphic effects to be offered to the user and their related user interface. The security manager 252 may provide various security functions necessary for system security or user authentication. According to an embodiment of the present disclosure, when the electronic device (e.g., the electronic device 101) has telephony capability, the middleware 230 may further include a telephony manager for managing voice call or video call functions of the electronic device.

The middleware 230 may include a middleware module forming a combination of various functions of the above-described components. The middleware 230 may provide a specified module per type of the operating system in order to provide a differentiated function. Further, the middleware 230 may dynamically omit some existing components or add new components.

The API 260 (e.g., the API 145) may be a set of, e.g., API programming functions and may have different configurations depending on operating systems. For example, in the case of Android or iOS, one API set may be provided per platform, and in the case of Tizen, two or more API sets may be offered per platform.

The application 270 (e.g., the application programs 147) may include one or more applications that may provide functions such as, e.g., a home 271, a dialer 272, a short message service (SMS)/multimedia messaging service (MMS) 273, an instant message (IM) 274, a browser 275, a camera 276, an alarm 277, a contact 278, a voice dial 279, an email 280, a calendar 281, a media player 282, an album 283, or a clock 284, a health-care (e.g., measuring the degree of workout or blood sugar), or provision of environmental information (e.g., provision of air pressure, moisture, or temperature information).

According to an embodiment of the present disclosure, the application 270 may include an application (hereinafter, "information exchanging application" for convenience) supporting information exchange between the electronic device (e.g., the electronic device 101) and an external electronic device (e.g., the electronic devices 102 and 104). Examples of the information exchange application may include, but is not limited to, a notification relay application for transferring specific information to the external electronic device, or a device management application for managing the external electronic device.

For example, the notification relay application may include a function for relaying notification information generated from other applications of the electronic device (e.g., the SMS/MMS application, email application, health-care application, or environmental information application) to the external electronic device (e.g., the electronic devices 102 and 104). Further, the notification relay application may receive notification information from, e.g., the external electronic device and may provide the received notification information to the user.

The device management application may perform at least some functions of the external electronic device (e.g., the electronic device 102 or 104) communicating with the electronic device (for example, turning on/off the external electronic device (or some components of the external electronic device) or control of brightness (or resolution) of the display), and the device management application may manage (e.g., install, delete, or update) an application operating in the external electronic device or a service (e.g., call service or message service) provided from the external electronic device.

According to an embodiment of the present disclosure, the application 270 may include an application (e.g., a health-care application of a mobile medical device) designated according to an attribute of the external electronic device (e.g., the electronic devices 102 and 104). According to an embodiment of the present disclosure, the application 270 may include an application received from the external electronic device (e.g., the server 106 or electronic devices 102 and 104). According to an embodiment of the present disclosure, the application 270 may include a preloaded application or a third party application downloadable from a server. The names of the components of the program module 210 according to the shown embodiment may be varied depending on the type of operating system.

According to an embodiment of the present disclosure, at least a part of the program module 210 may be implemented in software, firmware, hardware, or in a combination of two or more thereof. At least a part of the programming module 210 may be implemented (e.g., executed) by e.g., a processor (e.g., the processor 210). At least a part of the program module 210 may include e.g., a module, program, routine, set of instructions, process, or the like for performing one or more functions.

Figure 3:
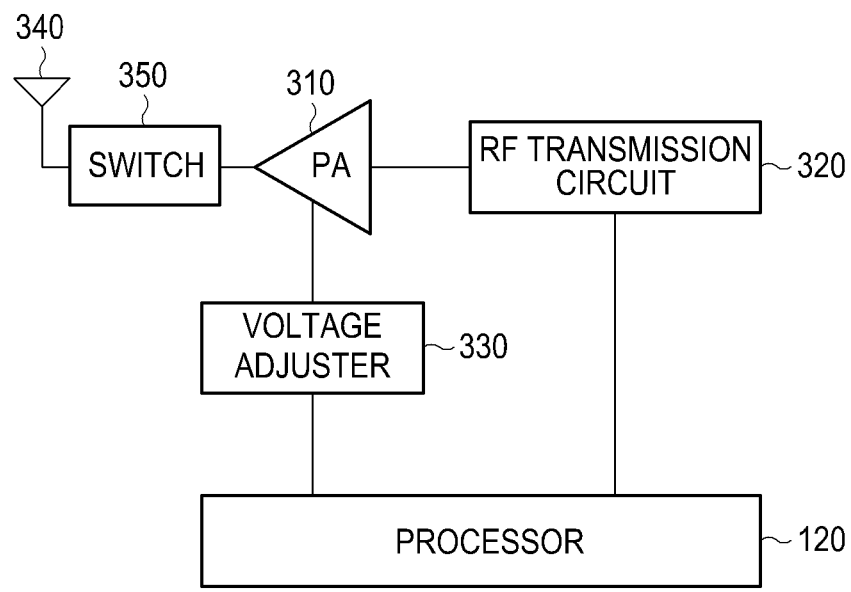
FIG. 3 illustrates an electronic device according to an embodiment of the present disclosure.

FIG. 3 illustrates an electronic device according to an embodiment of the present disclosure.

FIG. 3 is a block diagram schematically illustrating the structure of an electronic device 101 according to an embodiment of the present disclosure. According to an embodiment of the present disclosure, the electronic device 101 may include a processor 120, a PA 310, a RF transmission circuit 320, a voltage adjuster (or voltage regulator) 330, an antenna 340, and a switch 350. The components in the electronic device 101 may be electrically connected with one another.

The antenna 340 performs RF signal communication. The antenna 340 may be included in a housing or may be formed by a portion of the housing. The PA 310 may be electrically connected with the antenna 340 through the switch 350.

The RF transmission circuit 320 may be electrically connected with the processor 120 and the PA 310. The RF transmission circuit 320 may convert signals generated from the processor 120 into RF signals and may transmit the RF signals to the PA 310.

The voltage adjuster 330 may provide a PA operation voltage for the operation of the PA 310. The voltage adjuster 330 may supply a PA operation voltage determined by the processor 120 to the PA 310.

The processor 120 may select the output power of the PA required upon transmission of a RF signal through the antenna 340. The processor 120 may determine input power and a first PA operation voltage corresponding to the selected output power using information stored in the memory 130. A method for determining the input power and the first PA operation voltage using the information stored in the memory 130 by the processor 120 is described below.

The processor 120 may control the voltage adjuster 330 so that the determined first PA operation voltage is supplied to the PA 310 and may perform control so that the determined input power is supplied to the PA. Since the output power of the PA 310 is determined by the gain of the PA 310, the RF transmission circuit 320, and the processor 120, the processor 120 may control each component in the electronic device 101 so that the determined input power of the PA 310 is supplied to the PA 310. For example, the electronic device 101 may adjust code values for controlling each component so that the determined input power of the PA 310 is supplied to the PA 310.

Figure 4:
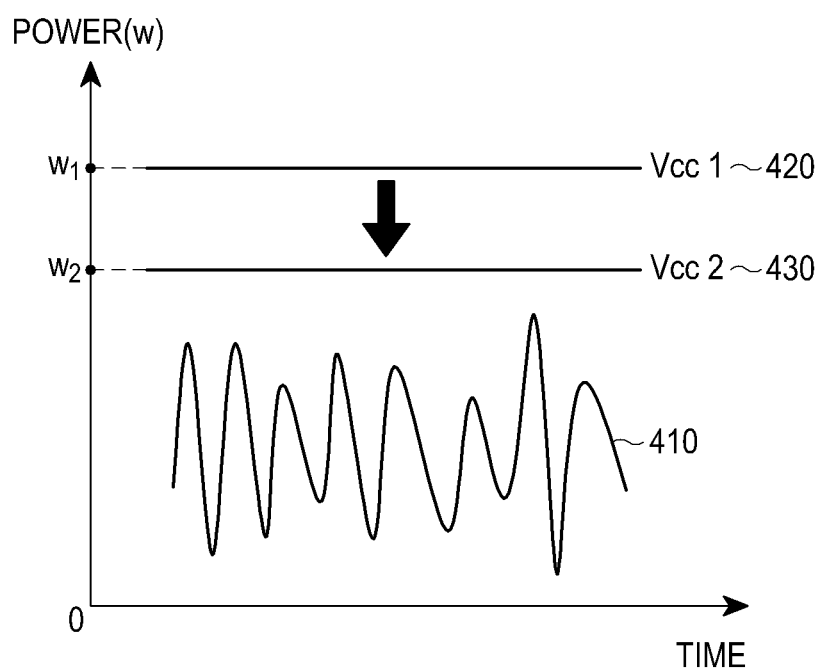
FIG. 4 illustrates a method for adjusting a voltage applied to a power amplifier (PA) according to an embodiment of the present disclosure.

FIG. 4 illustrates a method for adjusting a voltage applied to a power amplifier (PA) according to an embodiment of the present disclosure.

According to an embodiment of the present disclosure, the PA may amplify and output the power of a RF signal for RF signal transmission. For the PA to amplify the power of RF signal, a constant PA operation voltage may be supplied to the PA. As such, a power consumption may occur as the PA operates. When the electronic device 101 including the PA is operated by a capacity-limited power source, such as a battery, the power consumption of the PA is required to be reduced.

In order to reduce the power consumption of the PA, reducing the PA operation voltage supplied to the PA may lead to a decrease in the power consumption in the PA. However, the PA operation voltage needs to be adjusted so that the power consumed in the PA may be adjusted within a range not influencing the operation of the PA. Accordingly, a PA operation voltage may be set allowing the power consumption to be optimized corresponding to the output power of the PA.

It is assumed in connection with FIG. 4 that when Vcc1 420 is supplied to the PA as the PA operation voltage, a RF signal with the maximum first power W1 may be output through the PA, and when Vcc2 430 lower than Vcc1 420 is supplied to the PA as the PA operation voltage, a RF signal with the maximum second power W2 may be output through the PA. In such case, it is assumed that the maximum power of the RF signal 410 output through the PA is smaller than the second power W2, and Vcc1 420 is currently set to the PA operation voltage.

In this case, the RF signal 410 may be output through the PA even when supplied to the PA because Vcc2 430 is set to the PA operation voltage. Nonetheless, when Vcc1 420 is set to the PA operation voltage and is supplied to the PA, the PA may cause unnecessary power consumption. Accordingly, the PA operation voltage needs to be reset to Vcc2 430 which is lower than Vcc1 420 as currently set in order to reduce the power consumption in the course of outputting the RF signal 410.

As such, different PA operation voltages may be set to reduce the power consumed in the PA depending on output power levels necessary for transmission of the RF signal 410 during the course of performing calibration on the PA. Such PA operation voltages may be set based on the characteristics of the PA per power mode. Thus, the power consumed in the PA may be reduced.

Figure 5:
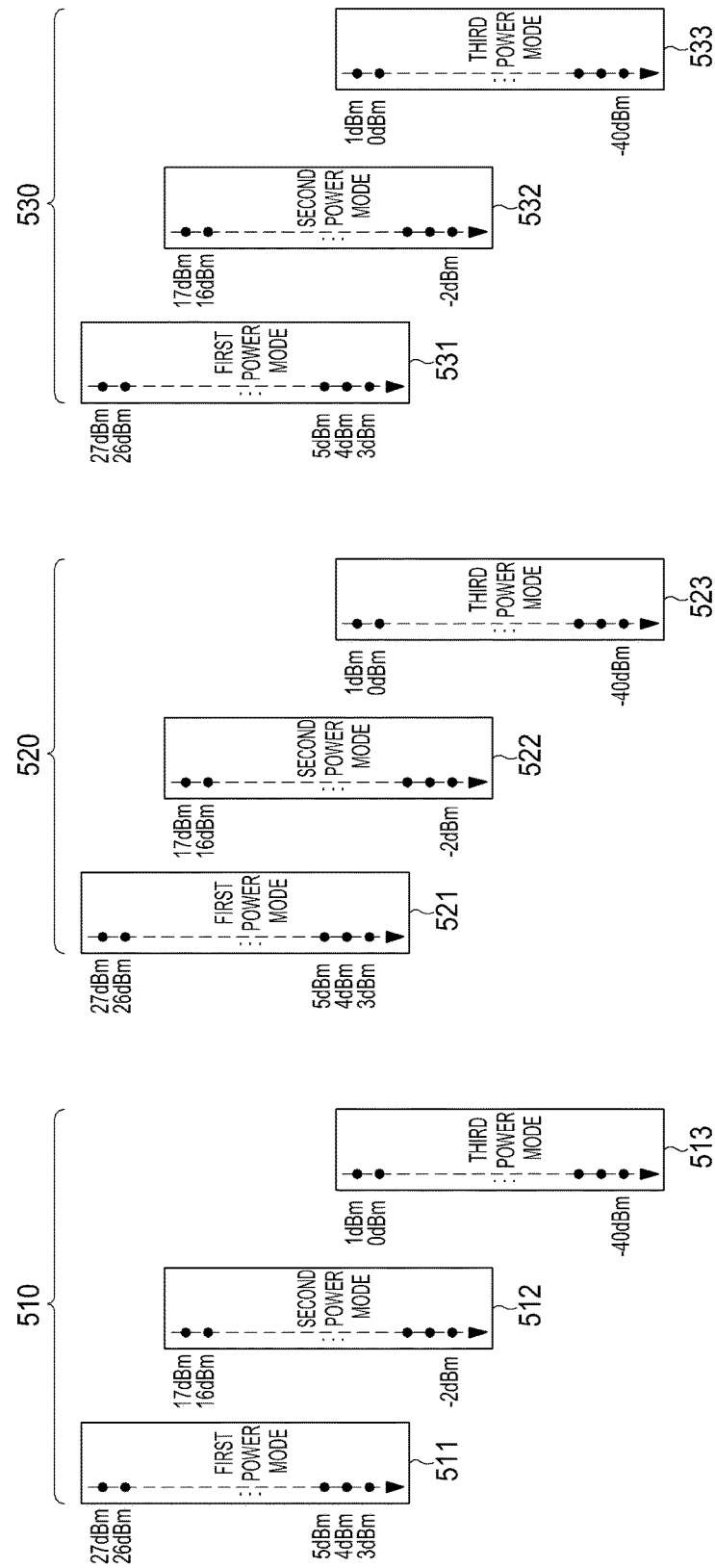
FIG. 5 illustrates a correction method for a PA according to a comparison example according to an embodiment of the present disclosure.

FIG. 5 illustrates a correction method for a PA according to a comparison example.

According to the comparison example, calibration on the PA is performed while varying the input power set for each frequency and power mode by the increment of one code (e.g., 1 dBm).

As shown in FIG. 5, calibration may be performed for the first frequency 510 in such a manner that all the input power levels respectively set for a first power mode 511, second power mode 512, and third power mode 513 corresponding to the first frequency 510 may be varied by the one-code increment while measuring the output power levels.

Likewise, calibration may also be performed for the second frequency 520 in such a manner that all the input power levels respectively set for a first power mode 521, second power mode 522, and third power mode 523 corresponding to the second frequency 520 may be varied by the one-code increment while measuring the output power levels. Calibration may also be performed for the third frequency 530 in such a manner that all the input power levels respectively set for a first power mode 531, second power mode 532, and third power mode 533 corresponding to the third frequency 530 may be varied by the one-code increment while measuring the output power levels.

When such process is performed for all the frequencies and per power mode, calibration would take much time and require unnecessary storage of the APT table and gain table for the result of the calibration and input power levels, causing the need for an excessive memory size.

Figure 6:
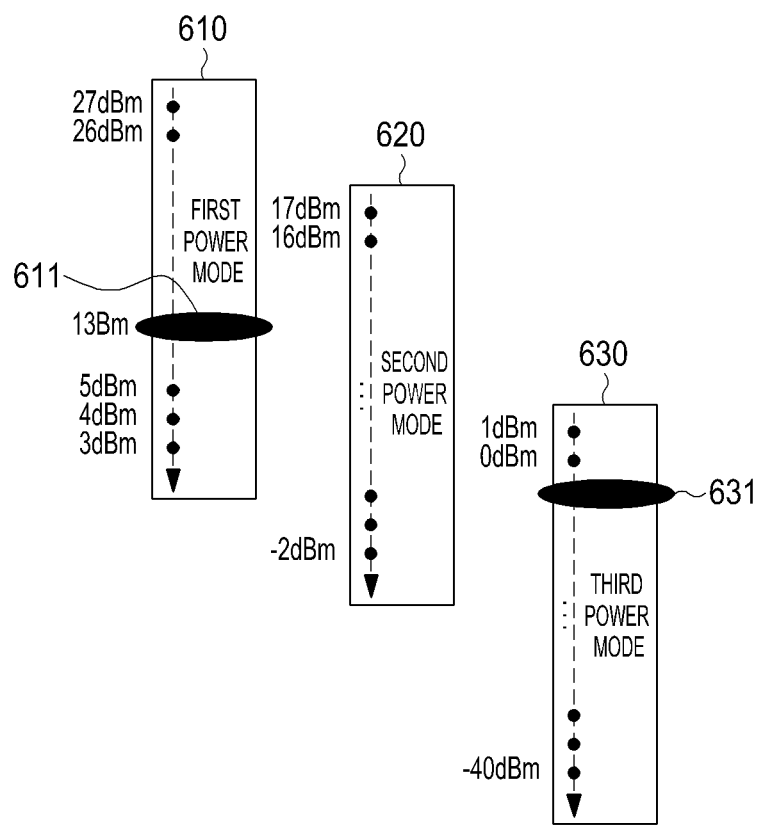
FIGS. 6 and 7 illustrate a method for performing calibration to provide the same characteristic per frequency and power mode according to an embodiment of the present disclosure.
Figure 7:
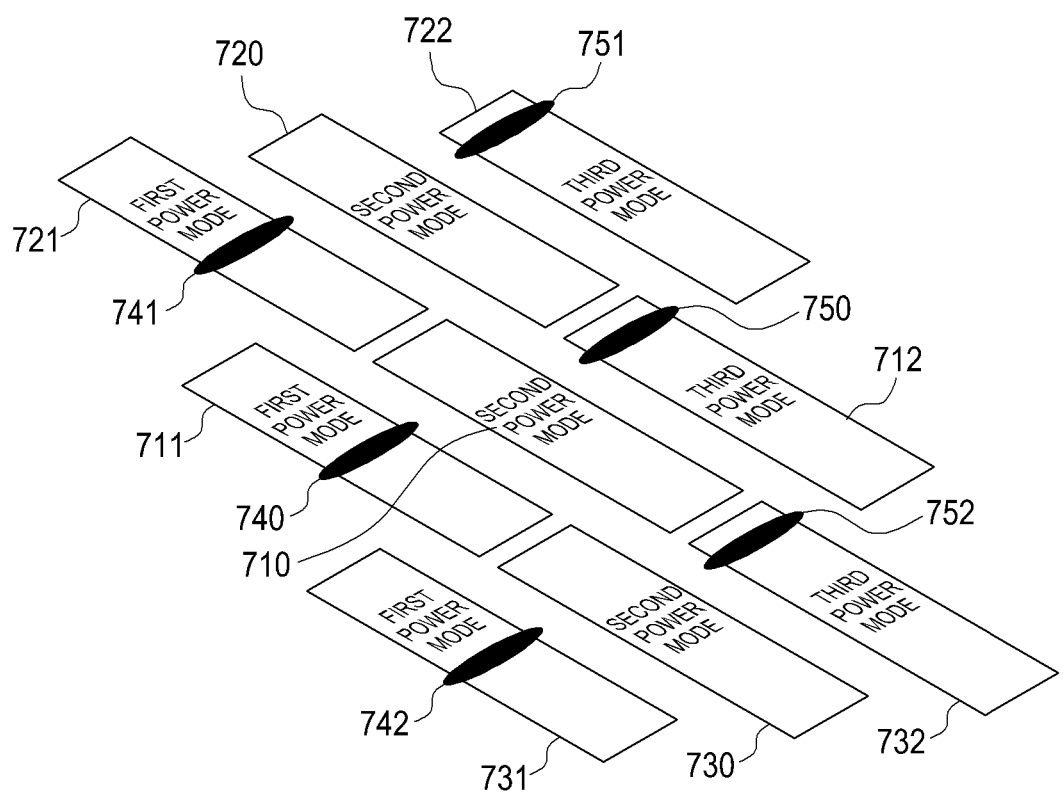

FIGS. 6 and 7 illustrate a method for performing calibration to provide the same characteristic per frequency and power mode according to an embodiment of the present disclosure.

According to an embodiment of the present disclosure, in order to reduce the time of calibration, calibration may be performed at a first frequency corresponding to one of a plurality of channels available for the electronic device 101. Further, the electronic device 101 may perform additional calibration on particular output power in order to determine the input power and PA operation voltage corresponding to the selected output power at a second frequency different from the first frequency.

For example, the electronic device 101 may obtain first information regarding the PA operation voltage and input power corresponding to the output power of the PA by performing calibration at the first frequency.

Further, the electronic device 101 may obtain second information regarding the PA operation voltage corresponding to the first output power of the PA at the second frequency different from the first frequency. The second information may contain information regarding the PA operation voltage for outputting the first output power through the PA at the second frequency. The second information may be generated with respect to the PA operation voltage corresponding to the first output power included in the first information.

Further, the electronic device 101 may obtain third information regarding input power corresponding to the second output power of the PA at the second frequency. The third information may be used to adjust an error for the input power corresponding to the second output power which is the same output power between the frequencies. For example, the electronic device may obtain the third information by comparing the input power at the second frequency corresponding to the particular second output power of the PA with the input power at the first frequency included in the first information. Similar to the second information, the third information may also be generated with respect to the input power corresponding to the second output power included in the first information.

The first output power for obtaining the second information and the second output power for obtaining the third information may be set to be the same or different from each other. Since the first output power and the second output power are for identifying and adjusting the relation between frequencies for the PA operation voltage and input power, they may be set to be the same or different from each other.

According to an embodiment of the present disclosure, each of the first information, the second information, and the third information may be stored in the memory 130 for each of the plurality of power modes of the PA set based on the characteristics of the PA. The plurality of power modes may have the same information on the variation rate between the input power and the output power even though having different gains between input power and output power depending on PA operation voltages. According to an embodiment of the present disclosure, the first information, the second information, and the third information may differ for each of the plurality of power modes. According to an embodiment of the present disclosure, the memory 130 may store the first information, the second information, and the third information for each of the plurality of power modes.

As shown in FIG. 6, the PA may operate at one of the first power mode 610, the second power mode 620, and the third power mode 630. Since each power mode has different variation rate information, the electronic device 101 may perform calibration per power mode for the first frequency. Further, the electronic device 101 may obtain the second information and the third information representing the relation with the second frequency for the input power and the PA operation voltage per power mode.

For example, the electronic device 101 may obtain the third information using the input power 611 corresponding to the first output power for the first power mode 610. Further, the electronic device 101 may obtain the second information using the PA operation voltage corresponding to the first output power. Likewise, the electronic device 101 may obtain the third information using the input power 631 corresponding to the second output power 631 for the third power mode 630. Further, the electronic device 101 may obtain the second information using the PA operation voltage corresponding to the first output power. Further, the calibration for obtaining the second information and the third information might not be performed for a particular power mode, e.g., the second power mode 620, by the user's settings.

As such, the second information and the third information obtained per power mode may be stored per power mode in the memory 130. Accordingly, when the output power for RF signal transmission is selected, the electronic device 101 may first identify the power mode corresponding to the selected output power prior to determining the input power and the PA operation voltage corresponding to the selected output power.

A method for obtaining the second information and the third information per power mode for a plurality of frequencies with respect to the first frequency has been described in connection with FIG. 7.

As described supra, the electronic device 101 may obtain the second information and the third information per power mode for a plurality of frequencies, e.g., the second and third frequencies, different from the first frequency, with respect to the first frequency.

Hereinafter, three power modes are assumed to be set for each frequency. For example, a first power mode 711, second power mode 710, and third power mode 712 may be set for the first frequency, a first power mode 721, second power mode 720, and third power mode 722 may be set for the second frequency, and a first power mode 731, second power mode 730, and third power mode 732 may be set for the third frequency.

The electronic device 101 may generate the third information that is information regarding the input power levels 740, 741, and 742 corresponding to the first output power per frequency for the first power mode and may generate the second information that is information regarding the PA operation voltage corresponding to the first output power. Each of the PA operation voltage and input power levels 741 and 742 at the second frequency and the third frequency may be obtained with respect to the input power level 740 and the PA operation voltage at the first frequency. For example, when the PA operation voltage corresponding to the first output power at the second frequency may be obtained by adding a first compensation value to the PA operation voltage corresponding to the first output power at the first frequency, the second information may contain information on the first compensation value. Accordingly, the first information and the second information both may be used to determine the PA operation voltage corresponding to the selected output power at the second frequency.

Likewise, the electronic device 101 may generate the second information and third information that are information on the input power levels 750, 751, and 752 and the PA operation voltage corresponding to the first frequency per frequency for the third power mode. Each of the PA operation voltage and input power levels 751 and 752 at the second frequency and the third frequency may be obtained with respect to the input power level 750 and the PA operation voltage at the first frequency.

Further, similar to FIG. 6, the calibration for generating the second information and the third information might not be performed for a particular power mode, e.g., the second power modes 710, 720, and 730, by the user's settings.

Figure 8:
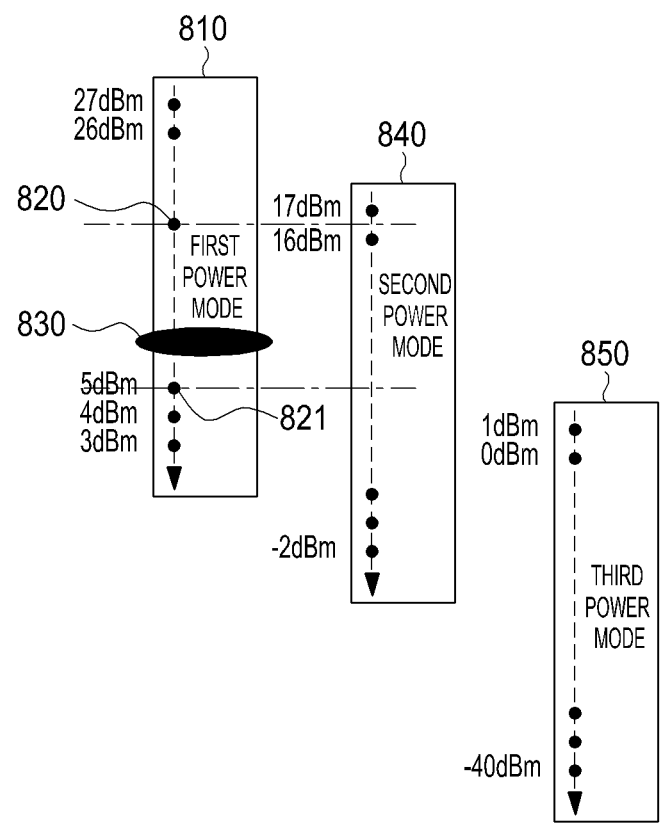
FIGS. 8 and 9 illustrate a method for determining a PA operation voltage at a second frequency according to an embodiment of the present disclosure.
Figure 9:
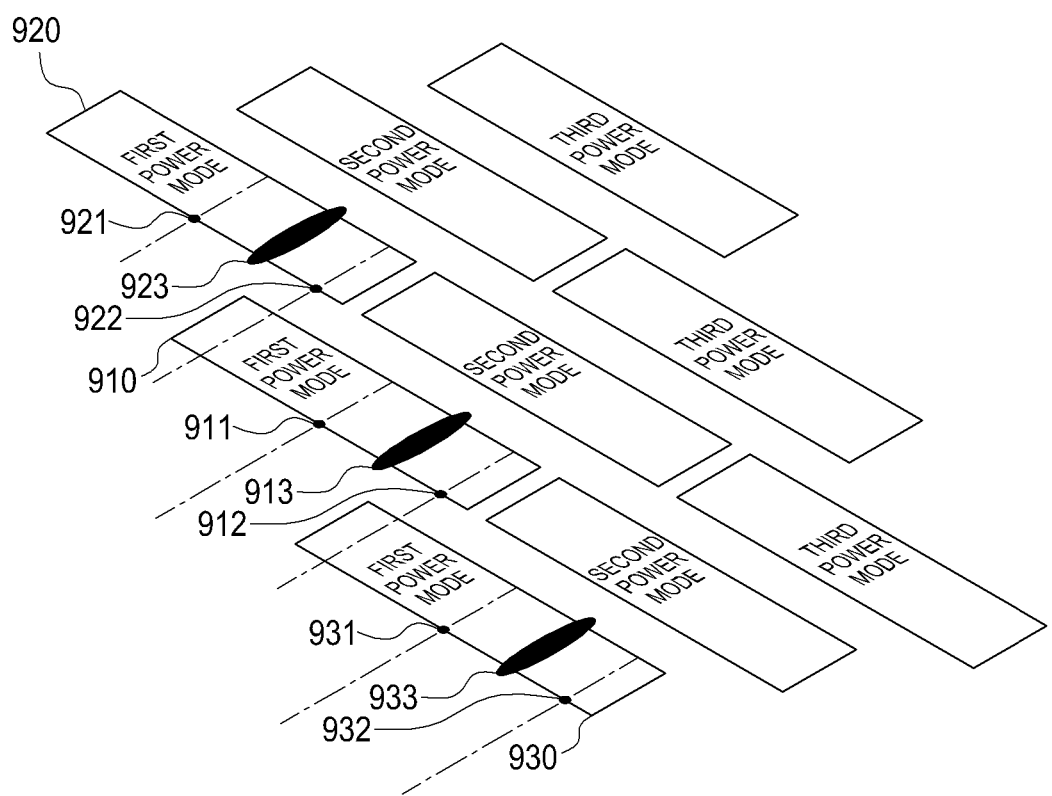

FIGS. 8 and 9 illustrate a method for determining a PA operation voltage at a second frequency according to an embodiment of the present disclosure.

As shown in FIG. 8, the electronic device 101 may obtain second information and third information for a preset output power range. In order to further reduce the time of calibration and the amount of data stored in the memory 130, an output power range primarily used for RF signal transmission may be set, and calibration may be performed to obtain the second information and the third information only within the set range.

As shown in FIG. 8, the electronic device 101 may set a range having the maximum output power 820 and the minimum output power 821 and set first output power and second output power 830 for obtaining the second information and the third information within the set range. The electronic device 101 may obtain the second information and the third information using the first output power and the second output power within the range.

As such, when the second information and the third information are obtained for the preset range, the electronic device 101 may first determine whether the selected output power belongs to the preset range prior to determining the input power and PA operation voltage corresponding to the selected output power.

Further, although not shown, a plurality of preset ranges may be present. For example, when there is a plurality of preset ranges, different output power levels for obtaining the second information and the third information may be set per range. Accordingly, the second information and the third information may differ per range, and the second information and the third information may be stored corresponding to each range.

Further, the preset ranges may be set to be different for each power mode 810, 840, 850. Thus, the electronic device 101 may identify the power mode corresponding to the selected output power and determine whether the selected output power belongs to the ranges set to be different per power mode.

As shown in FIG. 9, the electronic device 101 may adjust the preset range at the first frequency to fit each frequency, as well as the input power and the PA operation voltage corresponding to the first output power.

For example, the electronic device 101 may obtain input power levels 923 and 933 and the PA operation voltage corresponding to the first output power at each of the second frequency and the third frequency through calibration. The electronic device 101 may compare the input power level 913 and PA operation voltage corresponding to the first output power contained in the first information with the PA operation voltage and input power levels 923 and 933 corresponding to the first output power at each of the second frequency and the third frequency.

The electronic device 101 may adjust the preset range to fit each frequency based on the difference in the PA operation voltage and input power between the frequencies as obtained through the comparison. For example, the maximum output power 911 and the minimum output power 912 within the preset range at the first frequency may be adjusted to the maximum output power 921 and the minimum output power 922 at the second frequency and the maximum output power 931 and the minimum output power 932 at the third frequency.

Figure 10:
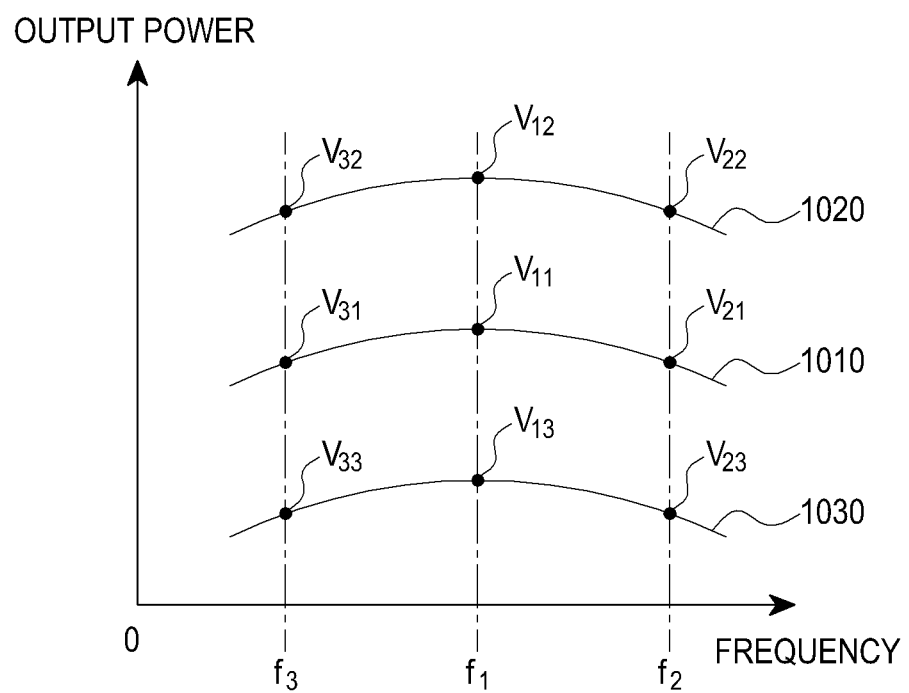
FIG. 10 illustrates a graph of the PA operation voltage adjusted corresponding to the frequency and output power according to an embodiment of the present disclosure.

FIG. 10 is a graph representing the PA operation voltage adjusted corresponding to the frequency and output power according to an embodiment of the present disclosure.

Described in connection with FIG. 10 is a method for the electronic device 101 to compute a first PA operation voltage corresponding to the selected output power at the second frequency $f_1$ and third frequency $f_3$ different from the first frequency $f_1$ using at least one of the first information and the second information.

In FIG. 10, the first curve 1010, the second curve 1020, and the third curve 1030 respectively correspond to the first output power, second output power, and third output power, and the voltage marked at each point may represent the PA operation voltage supplied to the PA to output the first output power, second output power, and third output power at each frequency.

For example, $V_{22}$ may be the PA operation voltage supplied to the PA to output the second output power at the second frequency $f_2$, and $V_{32}$ may be the PA operation voltage supplied to the PA to output the second output power at the third frequency $f_3$.

Hereinafter, it is assumed that the first output power is the output power used to generate the second information. Accordingly, the second information may contain information regarding the PA operation voltage $V_{21}$ at the second frequency $f_2$ corresponding to the first output power and the PA operation voltage $V_{31}$ at the third frequency $f_3$ corresponding to the first output power, which are PA operation voltages at the frequencies.

Further, calibration may be performed for the first frequency $f_1$, so that the first information regarding the PA operation voltage and input power corresponding to the output power of the PA may be stored in the memory 130.

Thus, the first information may include information regarding PA operation voltages $V_{11}$, $V_{12}$, and $V_{13}$ at the first frequency $f_1$ corresponding to each of the first output power, second output power, and third output power. Therefore, when the RF signal is communicated at the first frequency $f_1$, the electronic device 101 may determine the input power corresponding to the selected output power using the PA operation voltage corresponding to each output power level contained in the first information.

The electronic device 101 may compare the selected output power with the first output power to determine the PA operation voltage corresponding to the selected output power. When, as a result of the comparison, the selected output power is the same as the first output power, the electronic device 101 may determine the PA operation voltage corresponding to the first output power included in the second information as the first PA operation voltage.

For example, when the selected output power is the same as the first output power, and the RF signal is transmitted at the second frequency $f_2$, the electronic device 101 may determine that the first PA operation voltage corresponding to the selected output power is the PA operation voltage $V_{21}$ at the second frequency $f_2$ corresponding to the first output power included in the second information.

When the selected output power is different from the first output power, the electronic device 101 may compute a PA operation voltage corresponding to the selected output power included in the first information and a PA operation voltage corresponding to the selected output power using the second information. The electronic device 101 may determine the computed PA operation voltage as the first operation voltage corresponding to the selected output power.

When the selected output power is different from the first output power, the electronic device 101 may not use the result of calibration as it is and may compute the PA operation voltage corresponding to the selected output power using the result of the calibration. For example, the PA operation voltage corresponding to the selected output power may be computed by Equation 1.

$$V_{target,other} = V_{target} + \frac{F \times V_{target} \times (V_{cal,other} - V_{cal})}{V_{cal}} \quad \text{[Equation 1]}$$

Here, $V_{target}$ is the PA operation voltage at the first frequency $f_1$ corresponding to the calibration-selected output power, $V_{target,\ other}$ the PA operation voltage at a frequency different from the first frequency $f_1$ corresponding to the selected output power, $V_{cal}$ the PA operation voltage at a frequency different from the first frequency $f_1$ corresponding to the first output power, and $V_{cal,\ other}$ the PA operation voltage at a frequency different from the first frequency $f_1$ corresponding to the selected output power. F is a preset constant and may be set to differ depending on the result of comparison between the selected output power and the first output power.

According to a general PA characteristic, a relatively high PA operation voltage may apply to a high power level, and a relatively low PA operation voltage may apply to a low power level. Thus, when the PA operation voltage is calculated with respect to the first output power that has undergone the calibration, more specifically, in order to more exactly compute the PA operation voltage, different constants may be used in the course of computing the PA operation voltage depending on comparison results.

For example, when the selected output power corresponds to the second output power, and the RF signal is transmitted at the second frequency, the electronic device 101 may compute the PA operation voltage using a preset first constant F1 as shown in Equation 2 because the selected output power, which is the second output power, is larger than the first output power.

$$V_{22} = V_{12} + \frac{F1 \times V_{12} \times (V_{21} - V_{11})}{V_{11}} \quad \text{[Equation 2]}$$

Here, $V_{11}$ is the PA operation voltage at the first frequency $f_1$ corresponding to the first output power, $V_{12}$ the PA operation voltage at the first frequency $f_1$ corresponding to the selected output power, $V_{21}$ the adjusted PA operation voltage at the second frequency $f_2$ corresponding to the first output power, and $V_{22}$ the PA operation voltage at the second frequency $f_2$ corresponding to the selected output power.

By contrast, when the selected output power corresponds to the third output power, and the RF signal is transmitted at the second frequency, the electronic device 101 may compute the PA operation voltage using a preset second constant F2 as shown in Equation 3 because the selected output power, which is the third output power, is smaller than the first output power.

$$V_{23} = V_{13} + \frac{F2 \times V_{13} \times (V_{21} - V_{11})}{V_{11}} \quad \text{[Equation 3]}$$

Here, $V_{11}$ is the PA operation voltage at the first frequency $f_1$ corresponding to the first output power, $V_{13}$ the PA operation voltage at the first frequency $f_1$ corresponding to the selected output power, $V_{21}$ the adjusted PA operation voltage at the second frequency $f_2$ corresponding to the first output power, and $V_{23}$ the PA operation voltage at the second frequency $f_2$ corresponding to the selected output power.

As such, the electronic device 101 may compute the PA operation voltage at the second frequency $f_2$ and third frequency $f_3$ corresponding to the output power not subjected to calibration using the first information and the second information.

Further, a scheme for computing the PA operation voltage, e.g., an equation for computing the PA operation voltage using at least one of the first information and the second information, may be stored in the memory 130. The electronic device 101 may compute the PA operation voltage at the second frequency f2 and third frequency f3 corresponding to the output power not subjected to calibration using the stored equation as described above. Thus, data or codes stored in the memory 130 may be simplified without the need of storing all the results of performing calibration per frequency and output mode.

Figure 11:
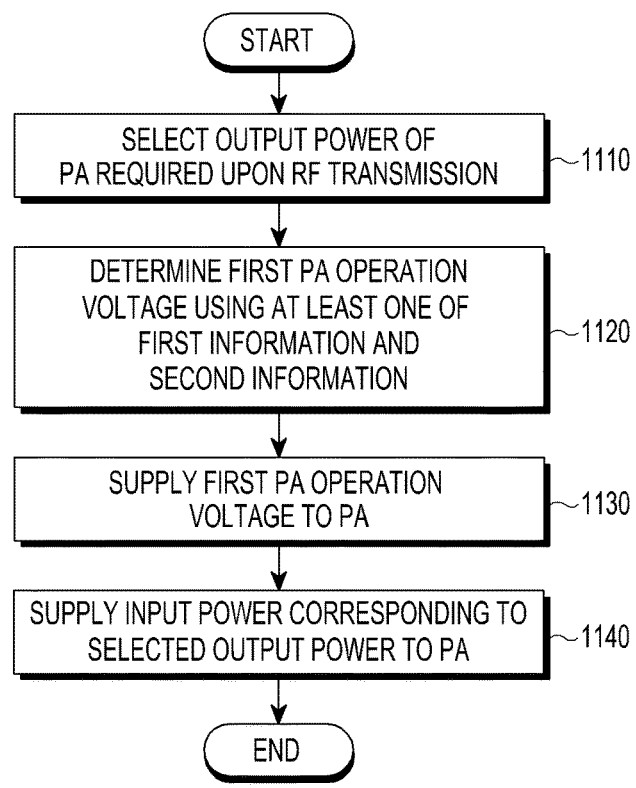
FIG. 11 illustrates a method for operating an electronic device according to an embodiment of the present disclosure.

FIG. 11 illustrates a method for operating an electronic device according to an embodiment of the present disclosure.

In operation 1110, the electronic device 101 may select the output power of the PA required upon RF signal transmission through the antenna. The electronic device 101 may select the output power of the PA based on the characteristics of the network connected with the electronic device 101.

In operation 1120, the electronic device may determine the first PA operation voltage corresponding to the selected output power using at least one of the first information and the second information stored in the memory 130. The electronic device 101 may determine the PA operation voltage corresponding to the output power not calibrated at the second frequency using the information stored in the memory. According to an embodiment of the present disclosure, data or codes stored in the memory 130 may be simplified since all the results of performing calibration need not be stored per frequency.

In operation 1130, the electronic device 101 may supply the determined first PA operation voltage to the PA. Accordingly, the electronic device 101 may adjust the PA operation voltage to supply the power optimized for the PA to output the selected output power.

In operation 1140, the electronic device 101 may perform control so that the input power corresponding to the selected output power at the second frequency may be supplied to the PA. The electronic device 101 may determine the input power corresponding to the selected output power using the third information and perform control so that the determined input power is supplied to the PA.

Figure 12:
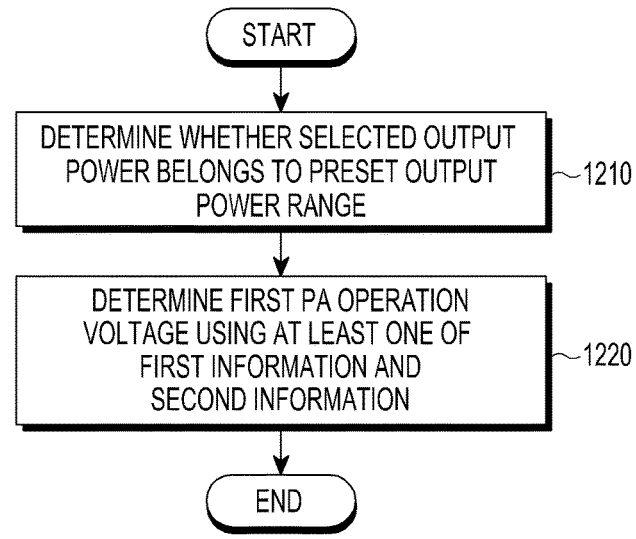
FIG. 12 illustrates a method for determining a first PA operation voltage by an electronic device according to an embodiment of the present disclosure.

FIG. 12 illustrates a method for determining a first PA operation voltage by an electronic device according to an embodiment of the present disclosure.

In operation 1210, the electronic device 101 may determine whether the selected output power belongs to a preset range of output power. The preset output power range may be set based on the characteristics of the PA and a plurality of power modes of the PA. In order to further reduce the time of calibration and the amount of data stored in the memory 130, an output power range primarily used for RF signal transmission may be set, and calibration may be performed to obtain the second information and the third information only within the set range.

In operation 1220, when the selected output power belongs to the preset output power range, the electronic device 101 may determine the first PA operation voltage corresponding to the selected output power using at least one of the first information and the second information.

Further, the first information, second information, and third information stored in the memory 130 may differ for each of a plurality of power modes of the PA. Accordingly, in operation 1220, the first power mode corresponding to the selected output power among the plurality of power modes may be identified before determining the first PA operation voltage. The electronic device 101 may determine the input power and PA operation voltage corresponding to the selected output power using the information corresponding to the identified first power mode.

Figure 13:
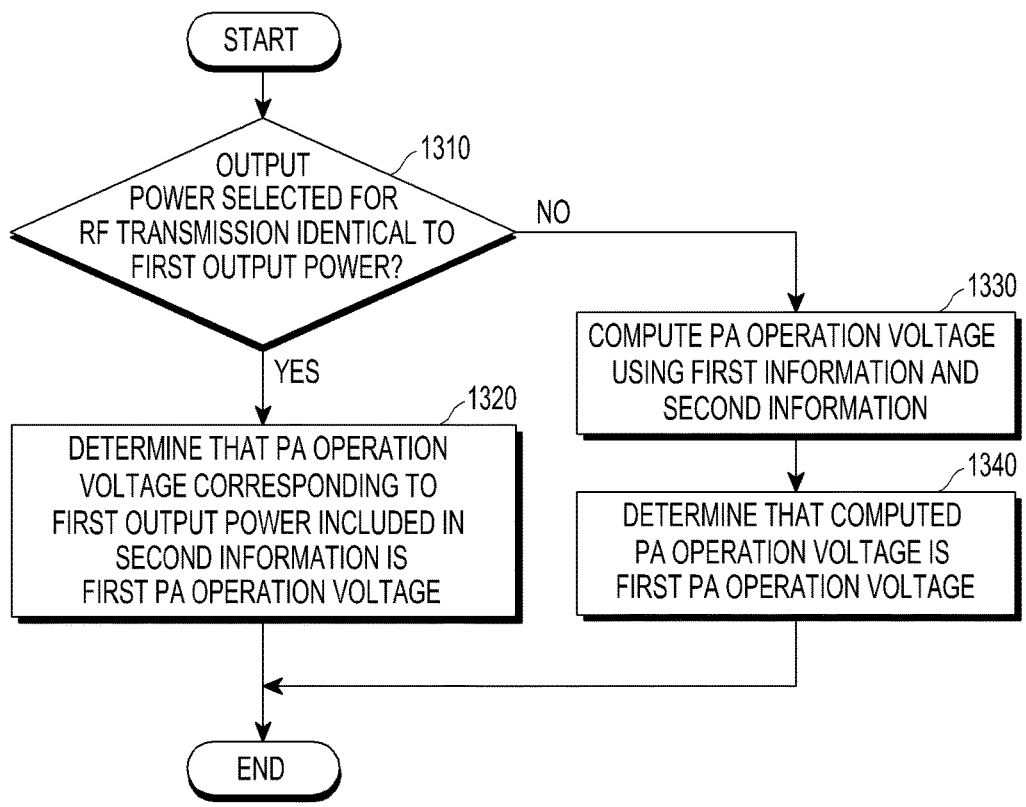
FIG. 13 illustrates a method for determining a first PA operation voltage by an electronic device according to an embodiment of the present disclosure.

FIG. 13 illustrates a method for determining a first PA operation voltage by an electronic device according to an embodiment of the present disclosure.

In operation 1310, the electronic device 101 may determine whether the selected output power for RF signal transmission is the same as the first output power. Since the first output power has been calibrated at each frequency, the electronic device 101 may determine whether the information previously stored in the memory 130 may directly be used by determining whether the selected output power is the same as the first output power.

In operation 1320, when the selected output power is the same as the first output power, the electronic device 101 may determine the PA operation voltage at the second frequency corresponding to the first output power included in the second information as the first PA operation voltage corresponding to the selected output power.

In operation 1330, when the selected output power is different from the first output power, the electronic device 101 may compute a PA operation voltage corresponding to the selected output power included in the first information and a PA operation voltage corresponding to the selected output power using the second information.

When the selected output power is different from the first output power, the electronic device 101 may not determine the first PA operation voltage using the information previously stored in the memory 130 as it is. In such case, the electronic device 101 may compute the PA operation voltage corresponding to the selected output power using the result of performing calibration.

In operation 1340, the electronic device 101 may determine the computed PA operation voltage as the first operation voltage corresponding to the selected output power.

Figure 14:
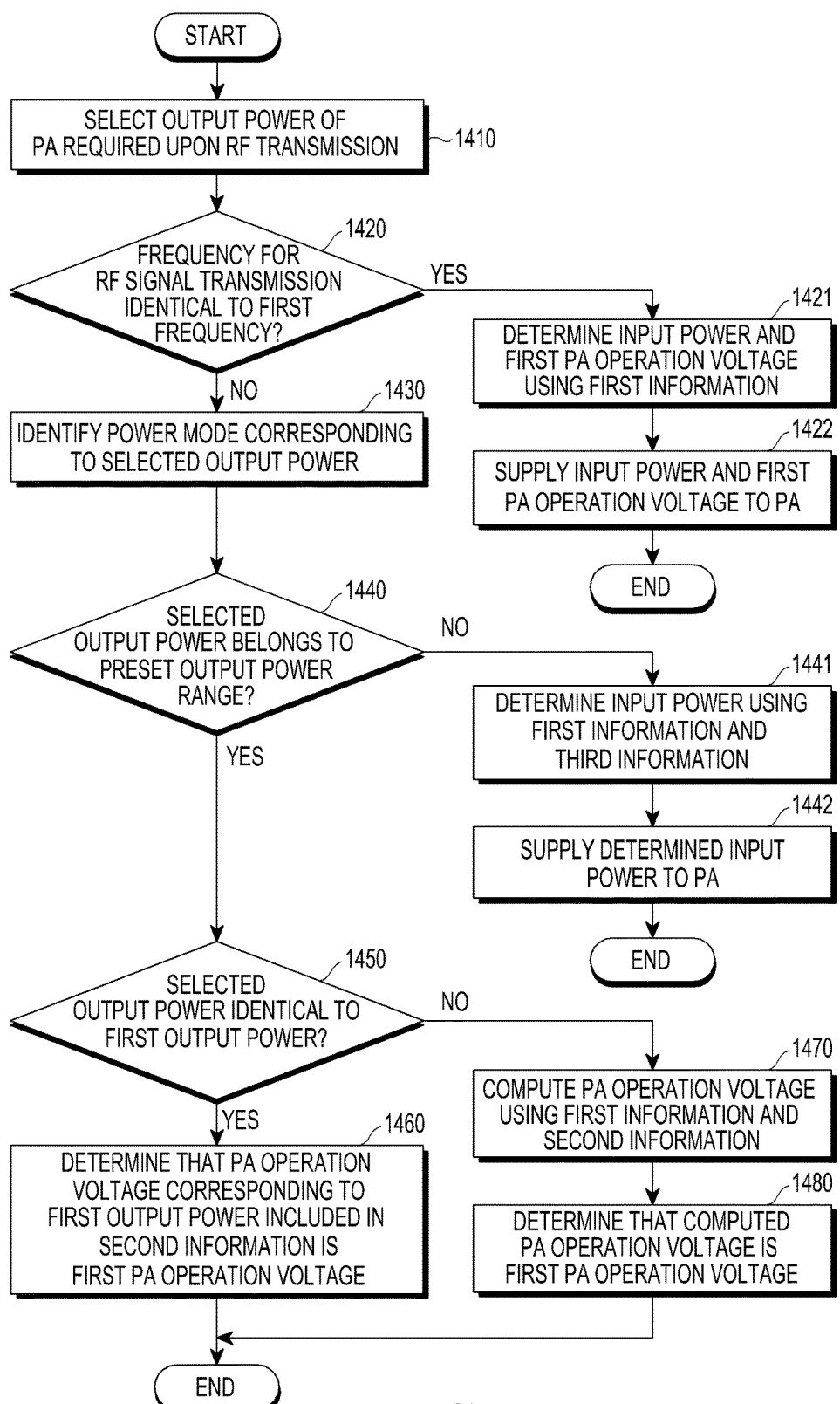
FIG. 14 illustrates a method for determining a PA operation voltage at a second frequency by an electronic device according to an embodiment of the present disclosure.

FIG. 14 illustrates a method for determining a PA operation voltage at a second frequency by an electronic device according to an embodiment of the present disclosure.

In operation 1410, the electronic device 101 may select the output power of the PA required upon RF signal transmission through the antenna. The electronic device 101 may select the output power of the PA based on the characteristics of the network connected with the electronic device 101.

In operation 1420, the electronic device 101 may determine whether the frequency used for RF signal transmission is the same as the first frequency. Since, for the first frequency, the PA operation voltage and input power corresponding to the selected output power may be determined using the first information regarding the PA operation voltage and input power corresponding to the output power of the PA, it may be identified whether the frequency used for RF signal transmission is the same as the first frequency.

In operation 1421, when the frequency for RF signal transmission is the first frequency, the electronic device 101 may determine that the first PA operation voltage is the PA operation voltage corresponding to the selected output power included in the first information.

In operation 1422, the electronic device 101 may supply the first PA operation voltage to the PA and supply the input power corresponding to the selected output power determined based on the first information to the PA.

In operation 1430, the electronic device 101 may identify the first power mode corresponding to the selected output power among the plurality of power modes of the PA. Since information on the variation rate between input power and output power differs per power mode, the first information and the second information may also differ per power mode. Accordingly, the electronic device 101 may use the information corresponding to the identified first power mode in order to determine the input power and PA operation voltage corresponding to the selected output power.

In operation 1440, the electronic device 101 may determine whether the selected output power belongs to a preset range of output power. The preset output power range may be set based on the characteristics of the PA and a plurality of power modes of the PA. In order to further reduce the time of calibration and the amount of data stored in the memory 130, an output power range primarily used for RF signal transmission may be set, and calibration may be performed to obtain the second information and the third information only within the set range.

In operation 1441, when the selected output power does not belong to the preset range, the electronic device 101 may determine the input power corresponding to the selected output power using the first information and the third information.

In operation 1442, the electronic device 101 may supply the determined input power to the PA. When the selected output power does not belong to the preset range, the PA operation voltage may not be determined separately. Thus, the PA operation voltage may be maintained as the existing PA operation voltage having been supplied to the PA.

In operation 1450, the electronic device 101 may determine whether the selected output power is the same as the first output power. Since the first output power has been calibrated at each frequency, the electronic device 101 may determine whether the information previously stored in the memory 130 may directly be used by determining whether the selected output power is the same as the first output power.

In operation 1460, when the selected output power is the same as the first output power, the electronic device 101 may determine the PA operation voltage corresponding to the first output power included in the second information as the first PA operation voltage. Calibration may also be performed at the second frequency for the first output power, and the second information may be generated based on the calibration. Thus, when the selected output power is the same as the first output power, the electronic device 101 may determine the first PA operation voltage using the second information including a result of the calibration.

In operation 1470, when the selected output power is different from the first output power, the electronic device 101 may compute a PA operation voltage corresponding to the selected output power included in the first information and a PA operation voltage corresponding to the selected output power using the second information.

When the selected output power is different from the first output power, the electronic device 101 may not determine the first PA operation voltage using the information previously stored in the memory 130 as it is. In such case, the electronic device 101 may compute the PA operation voltage corresponding to the selected output power using the result of performing calibration.

In operation 1480, the electronic device 101 may determine the computed PA operation voltage as the first operation voltage corresponding to the selected output power.

According to an embodiment of the present disclosure, a method for operating an electronic device for transmission of a radio frequency (RF) signal comprises selecting output power of a power amplifier (PA) required upon transmission of a signal with a second frequency through an antenna, determining a first PA operation voltage corresponding to the selected output power using first information stored in a memory of the electronic device and second information regarding a PA operation voltage corresponding to first output power of the PA at the second frequency, supplying the determined first PA operation voltage to the PA, and supplying input power corresponding to the selected output power at the second frequency to the PA, wherein the first information may be information regarding a PA operation voltage and input power corresponding to output power of the PA at a first frequency different from the second frequency.

According to an embodiment of the present disclosure, determining the first PA operation voltage may include determining whether the selected output power belongs to a preset output power range, and when the selected output power belongs to the preset output power range, determining the first PA operation voltage corresponding to the selected output power using the second information.

According to an embodiment of the present disclosure, determining the first PA operation voltage may include, when the selected output power is the same as the first output power, determining that a PA operation voltage corresponding to the first output power included in the second information is the first PA operation voltage.

According to an embodiment of the present disclosure, determining the first PA operation voltage may include, when the selected output power is different from the first output power, computing a PA operation voltage corresponding to the selected output power included in the first information and a PA operation voltage corresponding to the selected output power using the second information and determining that the computed PA operation voltage is the first PA operation voltage.

According to an embodiment of the present disclosure, computing the PA operation voltage corresponding to the selected output power may include, when the selected output power is larger than the first output power, computing the PA operation voltage using a first constant (F1).

According to an embodiment of the present disclosure, computing the PA operation voltage corresponding to the selected output power may include, when the selected output power is smaller than the first output power, computing the PA operation voltage using a second constant (F2).

According to an embodiment of the present disclosure, the memory may store the first information and the second information for each of a plurality of power modes based on a characteristic of the PA.

According to an embodiment of the present disclosure, the method may further comprise identifying a first power mode corresponding to the selected output power among the plurality of power modes, and determining the first PA operation voltage may include determining the first PA operation voltage corresponding to the selected output power using at least one of the first information and the second information corresponding to the first power mode.

According to an embodiment of the present disclosure, the memory may further include third information regarding input power corresponding to second output power of the PA adjusted based on the first information at the second frequency.

According to an embodiment of the present disclosure, supplying the input power to the PA may include supplying input power corresponding to the selected output power determined using the third information to the PA.

Figure 15:
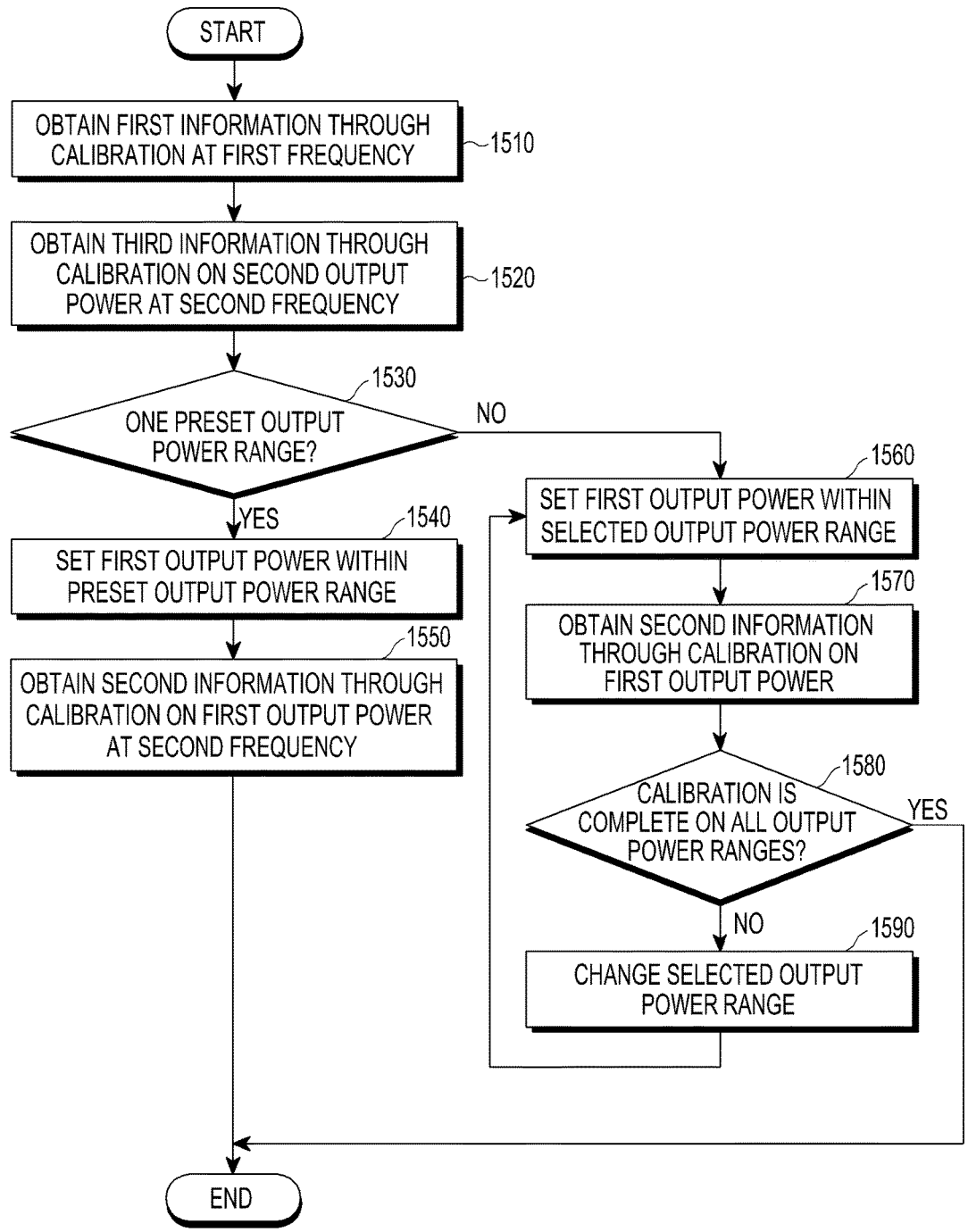
FIG. 15 illustrates a method for performing calibration on a PA according to an embodiment of the present disclosure.

FIG. 15 illustrates a method for performing calibration on a PA according to an embodiment of the present disclosure.

A method for calibrating the PA is described with reference to FIG. 15. The calibration on the PA may be carried out with the PA, the electronic device 101, and the first electronic device performing the calibration connected together. The electronic device 101 may receive and store at least one of first information, second information, or third information obtained as the first electronic device performs calibration.

In operation 1510, the first electronic device may obtain the first information regarding the PA operation voltage and input power corresponding to the output power of the PA through calibration at the first frequency. The first electronic device may obtain the first information by performing calibration at the first frequency corresponding to a first channel among a plurality of channels available for RF signal transmission.

In operation 1520, the first electronic device may obtain the third information regarding the input power corresponding to the second output power through the calibration on the second output power among output power of the PA at the second frequency different from the first frequency.

In operation 1530, the first electronic device may determine whether the number of preset output power ranges is one to determine the PA operation voltage corresponding to the output power upon RF signal transmission. When there are a plurality of preset output power ranges, the second information needs to be obtained for each range. Thus, the first electronic device may identify the number of preset output power ranges.

In operation 1540, when the number of preset output power ranges is one, the first electronic device may set the first output power within the output power range.

In operation 1550, the first electronic device may obtain the second information regarding the PA operation voltage corresponding to the first output power at the second frequency different from the first frequency.

In operation 1560, when the number of preset output power ranges is two or more, the first electronic device may set the first output power within the selected output power range among the plurality of output power ranges.

In operation 1570, the first electronic device may obtain the second information regarding the PA operation voltage corresponding to the first output power within the selected output power range at the second frequency.

In operation 1580, the first electronic device may determine whether calibration has been complete on all of the plurality of output power ranges. When calibration has been complete on all of the plurality of output power ranges, the calibration process may be terminated.

In operation 1590, unless calibration has been complete on all the output power ranges, the first electronic device may change the selected output power range to another output power range among the plurality of output power ranges and may perform calibration on the changed output power range to obtain the second information. The first electronic device may perform the operation of obtaining the second information corresponding to each of the plurality of output power ranges until calibration is complete on all of the plurality of output power ranges.

Figure 16A:
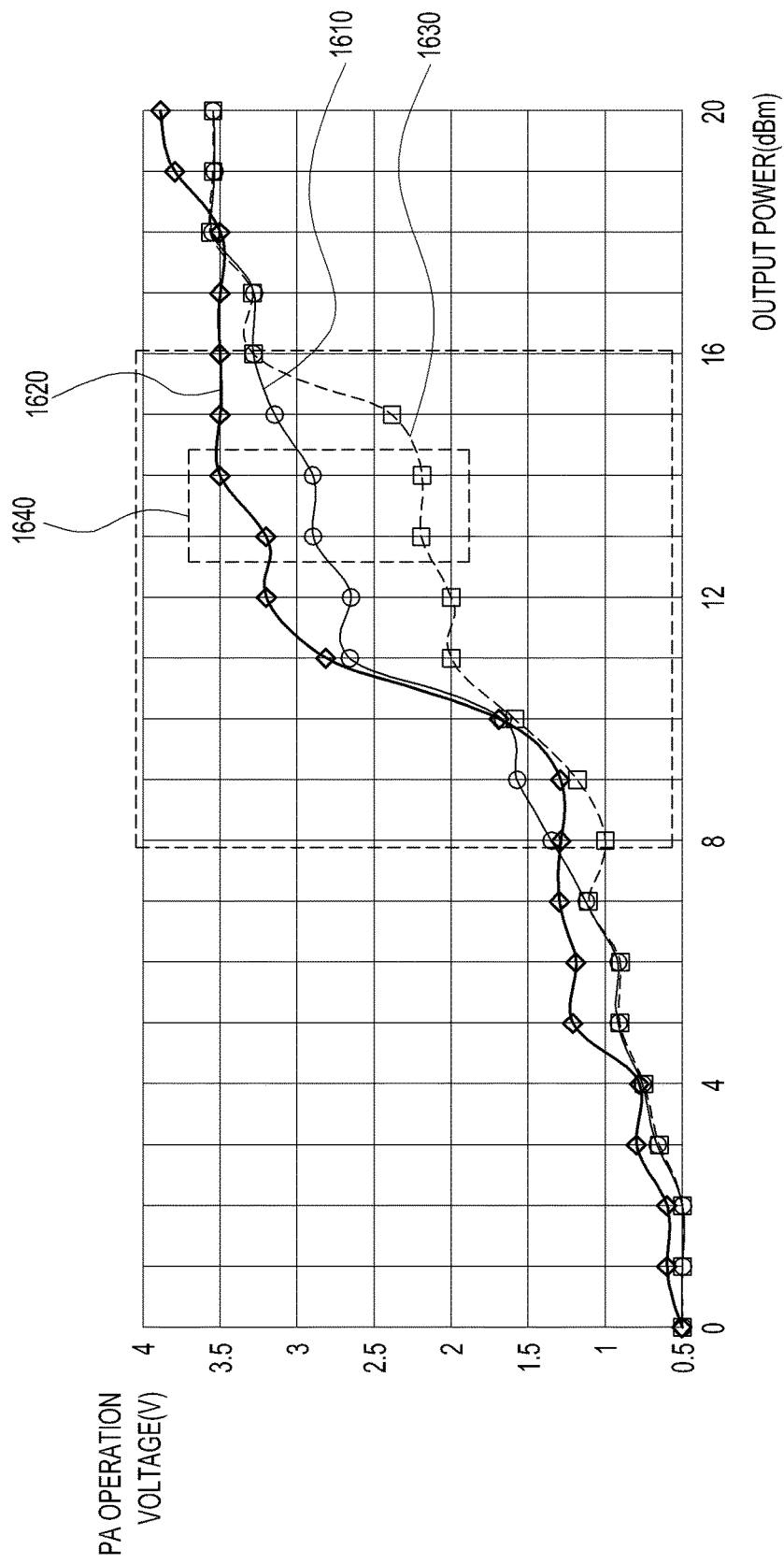
FIG. 16a illustrates a graph of a relationship between output power and PA operation voltage according to an embodiment of the present disclosure.

FIG. 16a is a graph representing a relation between output power and PA operation voltage according to an embodiment of the present disclosure.

FIG. 16a illustrates a first curve 1610 representing the relation between output power and PA operation voltage corresponding to the output power at the second frequency determined based on at least one of the first information and second information, a second curve 1620 representing the relation between output power and the PA operation voltage corresponding to the output power at the second frequency determined according to a result of performing calibration at the second frequency, and a third curve 1630 representing the relation between output power and the PA operation voltage corresponding to the output power at the first frequency determined based on the first information.

Further, it is assumed in FIG. 16a that the PA operation voltage corresponding to the output power at the second frequency is determined based on the first information and second information only within an output power range from 8 dBm to 16 dBm and that the PA operation voltage corresponding to the output power is determined based on the result of the calibration for other ranges than the above range. Various output power ranges may be set depending on the user's settings considering, e.g., PA operation characteristics or output power more frequently used upon RF signal transmission.

As described above, since the PA operation voltage is determined based on the first information and second information only within the range from 8 dBm to 16 dBm while the PA operation voltage corresponding to the output power is determined based on the result of the calibration for the other ranges than the above range, the first curve 1610 may be the same as the third curve 1630 for the other ranges than the above range.

By contrast, since methods for determining the PA operation voltage corresponding to the output power differ in the range, the first curve 1610 may be different from the third curve 1630. However, since the PA operation voltage on the first curve 1610 may be determined based on at least one of the first information and the second information obtained as the result of calibration, it may be rendered to match, through a predetermined correspondence, the third curve representing the relation with the PA operation voltage corresponding to the output power at the first frequency determined based on the first information. Matching between the first curve 1610 and the third curve 1630 through the predetermined correspondence is described below with reference to FIG. 16b.

In contrast, since the PA operation voltage on the second curve 1620 is determined using the result of calibration at the second frequency, even when the PA operation voltages at the first frequency corresponding to different, adjacent output power levels, the PA operation voltages on the second curve 1620 corresponding to different output power levels may differ from each other. On the contrary, as set forth above, as matching occurs between the first curve 1610 and the third curve 1630 through the predetermined correspondence, when the PA operation voltages at the first frequency corresponding to different output power levels are the same, the PA operation voltages on the first curve 1610 corresponding to the different output power levels are the same.

For example, when the same third curve 1630 is presented corresponding to adjacent, different output power levels as shown in the area 1640 of FIG. 16a, the PA operation voltages on the second curve 1620 corresponding to the different output power levels may differ from each other, but the PA operation voltages on the first curve 1610 corresponding to the different output power levels are identical to each other.

Figure 16B:
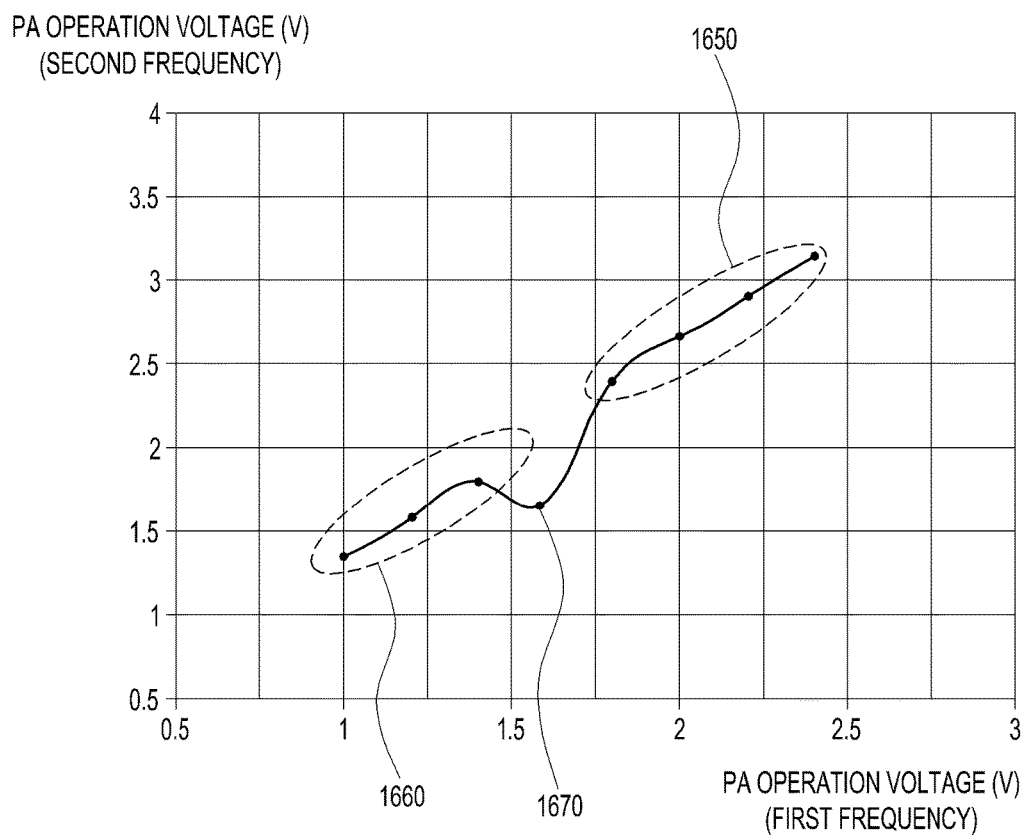
FIG. 16b illustrates a graph of a corresponding relationship between a PA operation voltage at a first voltage within a preset range and a PA operation voltage at a second frequency according to an embodiment of the present disclosure.

FIG. 16b is a graph representing a corresponding relation between a PA operation voltage at a first voltage within a preset range and a PA operation voltage at a second frequency according to an embodiment of the present disclosure.

The electronic device 101 may determine the first PA operation voltage at the second frequency corresponding to the output power within the preset range using at least one of the first information and second information.

When the selected output power differs from the first output power, the electronic device 101 may determine the first PA operation voltage using a preset equation as described above in connection with FIG. 10. As set forth in Equation 1, the determined first PA operation voltage may one-to-one match the PA operation voltage corresponding to the selected output power at the first frequency. Further, since the matching relation between the first PA operation voltage and the PA operation voltage corresponding to the selected output power at the first frequency uses such a preset equation as Equation 1, the correspondence between the PA operation voltage at the first frequency and the PA operation voltage at the second frequency may be shown linearly or regularly.

As shown in the first area 1650 and the second area 1660 in the graph of FIG. 16b, the correspondence between the PA operation voltage at the first frequency corresponding to the selected output power and the PA operation voltage at the second frequency may be presented linearly or regularly.

Further, when the selected output power is the same as the first output power, the electronic device 101 may determine that the PA operation voltage corresponding to the first output power included in the second information is the first PA operation voltage.

As such, when the selected output power is the same as the first output power, the first PA operation voltage is determined based on the second information obtained as a result of calibration. Thus, the correspondence the PA operation voltage at the first frequency corresponding to the first output power and the PA operation voltage at the second frequency may differ from the correspondence between the PA operation voltage at the first frequency and PA operation voltage at the second frequency corresponding to the first area 1650 and the second area 1660.

The points 1670 representing the PA operation voltage at the first frequency and the PA operation voltage at the second frequency in the case where the selected output power is the same as the first output power as shown in FIG. 16b may be displayed on the graph to be different from the linear and regular correspondence shown in the first area 1650 and second area 1660. Unlike this, the second curve 1620 and third curve 1630 as shown in FIG. 16a do not correspond to each other, and the correspondence between the second curve 1620 and the third curve 1630 may be shown irregularly or unpredictably depending on the result of calibration.

Figure 17:
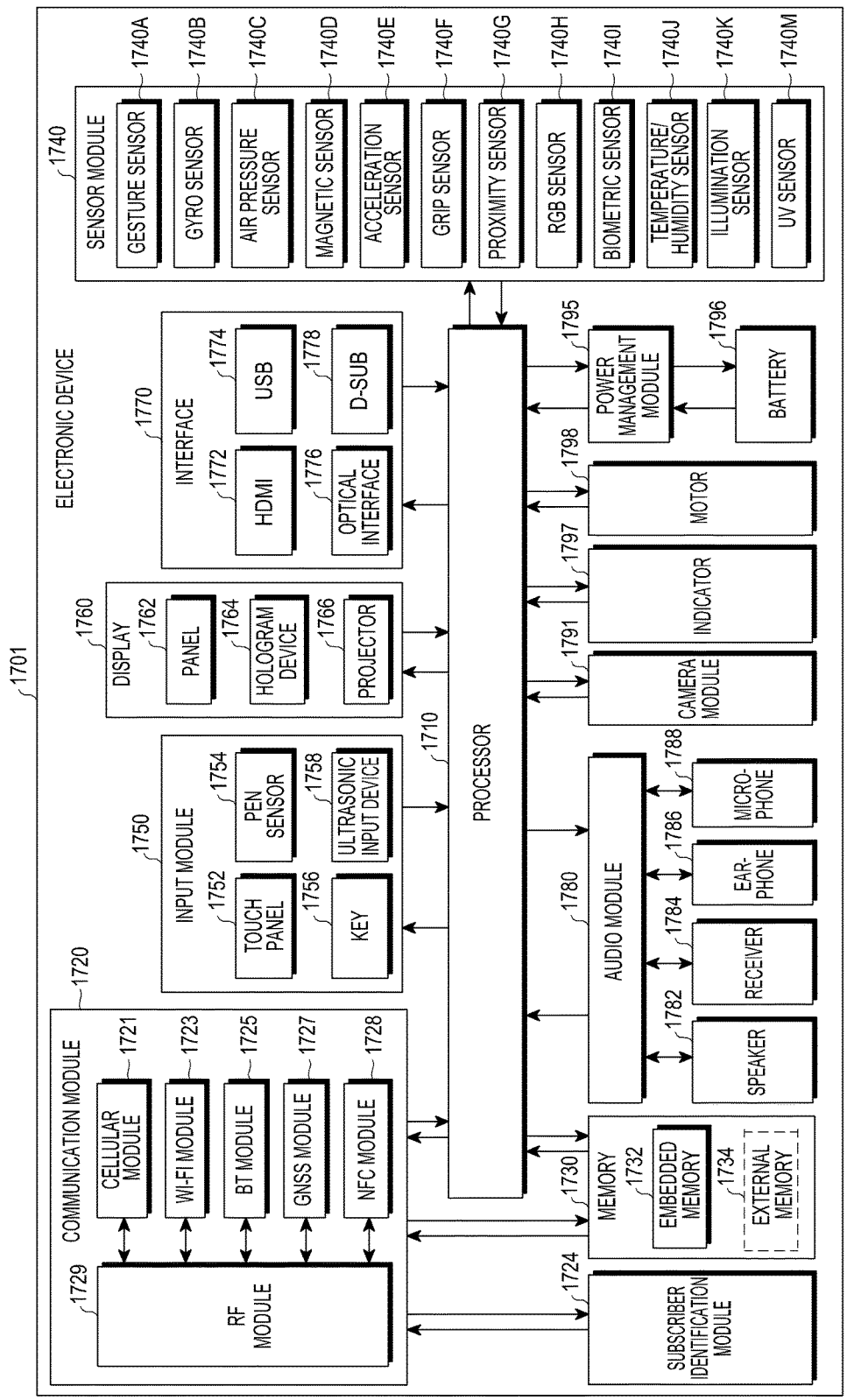
FIG. 17 illustrates an electronic device according to an embodiment of the present disclosure.

FIG. 17 illustrates an electronic device 1701 according to an embodiment of the present disclosure. The electronic device 1701 may include the whole or part of the configuration of, e.g., the electronic device 101 shown in FIG. 1. The electronic device 1701 may include one or more processors (e.g., application processors (APs)) 1710, a communication module 1720, a subscriber identification module (SIM) 1724, a memory 1730, a sensor module 1740, an input device 1750, a display 1760, an interface 1770, an audio module 1780, a camera module 1791, a power management module 1795, a battery 1796, an indicator 1797, and a motor 1798.

The processor 1710 may control multiple hardware and software components connected to the processor 1710 by running, e.g., an operating system or application programs, and the processor 1710 may process and compute various data. The processor 1710 may be implemented in, e.g., a system on chip (SoC). According to an embodiment of the present disclosure, the processor 1710 may further include a graphic processing unit (GPU) and/or image signal processor. The processor 1710 may include at least some (e.g., the cellular module 1721) of the components shown in FIG. 17. The processor 1710 may load a command or data received from at least one of other components (e.g., a non-volatile memory) on a volatile memory, process the command or data, and store various data in the non-volatile memory.

The communication module 1720 may have the same or similar configuration to the communication modules of FIG. 1. The communication module 1720 may include, e.g., a cellular module 1721, a Wi-Fi module 1723, a Bluetooth module 1725, a GNSS module 1727 (e.g., a GPS module, a Glonass module, a Beidou module, or a Galileo module), an NFC module 1728, and a radio frequency (RF) module 1729.

The cellular module 1721 may provide voice call, video call, text, or Internet services through, e.g., a communication network. The cellular module 1721 may perform identification or authentication on the electronic device 1701 in the communication network using a subscriber identification module 1724 (e.g., the SIM card). According to an embodiment of the present disclosure, the cellular module 1721 may perform at least some of the functions provided by the processor 1710. According to an embodiment of the present disclosure, the cellular module 1721 may include a communication processor (CP).

The Wi-Fi module 1723, the Bluetooth module 1725, the GNSS module 1727, or the NFC module 1728 may include a process for, e.g., processing data communicated through the module. According to an embodiment of the present disclosure, at least some (e.g., two or more) of the cellular module 1721, the Wi-Fi module 1723, the Bluetooth module 1725, the GNSS module 1727, or the NFC module 1728 may be included in a single integrated circuit (IC) or an IC package.

The RF module 1729 may communicate data, e.g., communication signals (e.g., RF signals). The RF module 1729 may include, e.g., a transceiver, a power amplifier module (PAM), a frequency filter, a low noise amplifier (LNA), or an antenna. According to an embodiment of the present disclosure, at least one of the cellular module 1721, the Wi-Fi module 1723, the Bluetooth module 1725, the GNSS module 1727, or the NFC module 1728 may communicate RF signals through a separate RF module.

The subscription identification module 1724 may include, e.g., a card including a subscriber identification module and/or an embedded SIM, and may contain unique identification information (e.g., an integrated circuit card identifier (ICCID) or subscriber information (e.g., an international mobile subscriber identity (IMSI)).

The memory 1730 (e.g., the memory 130) may include, e.g., an internal memory 1732 or an external memory 1734. The internal memory 1732 may include at least one of, e.g., a volatile memory (e.g., a dynamic random access memory (DRAM), a static RAM (SRAM), a synchronous dynamic RAM (SDRAM), etc.) or a non-volatile memory (e.g., a one time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash, or a NOR flash), a hard drive, or solid state drive (SSD).

The external memory 1734 may include a flash drive, e.g., a compact flash (CF) memory, a secure digital (SD) memory, a micro-SD memory, a min-SD memory, an extreme digital (xD) memory, a multi-media card (MMC), or a Memory Stick™. The external memory 1734 may be functionally and/or physically connected with the electronic device 1701 via various interfaces.

For example, the sensor module 1740 may measure a physical quantity or detect a motion state of the electronic device 1701, and the sensor module 1740 may convert the measured or detected information into an electrical signal. The sensor module 1740 may include at least one of e.g., a gesture sensor 1740A, a gyro sensor 1740B, an air pressure sensor 1740C, a magnetic sensor 1740D, an acceleration sensor 1740E, a grip sensor 1740F, a proximity sensor 1740G, a color sensor 1740H such as an red-green-blue (RGB) sensor, a bio sensor 1740L a temperature/humidity sensor 1740J, an illumination sensor 1740K, or an ultra violet (UV) sensor 1740M. Additionally or alternatively, the sensor module 1740 may include, e.g., an E-nose sensor, an electromyography (EMG) sensor, an electroencephalogram (EEG) sensor, an electrocardiogram (ECG) sensor, an infrared (IR) sensor, an iris sensor, or a finger print sensor. The sensor module 1740 may further include a control circuit for controlling at least one or more of the sensors included in the sensor module. According to an embodiment of the present disclosure, the electronic device 1701 may further include a processor configured to control the sensor module 1740 as part of the processor 1710 or separately from the processor 1710, and the electronic device 1701 may control the sensor module 1740 while the processor 1710 is in a sleep mode.

The input device 1750 may include, e.g., a touch panel 1752, a (digital) pen sensor 1754, a key 1756, or an ultrasonic input device 1758. The touch panel 1752 may use at least one of capacitive, resistive, infrared, or ultrasonic methods. The touch panel 1752 may further include a control circuit. The touch panel 1752 may further include a tactile layer and may provide a user with a tactile reaction.

The (digital) pen sensor 1754 may include, e.g., a part of a touch panel or a separate sheet for recognition. The key 1756 may include e.g., a physical button, optical key or key pad. The ultrasonic input device 1758 may sense an ultrasonic wave generated from an input tool through a microphone to identify data corresponding to the sensed ultrasonic wave.

The display 1760 may include a panel 1762, a hologram device 1764, or a projector 1766. The panel 1762 may be implemented to be flexible, transparent, or wearable. The panel 1762 may also be incorporated with the touch panel 1752 in a module. The hologram device 1764 may make three dimensional (3D) images (holograms) in the air by using light interference. The projector 1766 may display an image by projecting light onto a screen. The screen may be, for example, located inside or outside of the electronic device 1701. In accordance with an embodiment, the display 1760 may further include a control circuit to control the panel 1762, the hologram device 1764, or the projector 1766.

The interface 1770 may include e.g., a High Definition Multimedia Interface (HDMI) 1772, a USB 1774, an optical interface 1776, or a D-subminiature (D-sub) 1778. Additionally or alternatively, the interface 1770 may include a Mobile High-definition Link (MHL) interface, a secure digital (SD) card/multimedia card (MMC) interface, or infrared data association (IrDA) standard interface.

The audio module 1780 may convert a sound into an electric signal or vice versa, for example. At least a part of the audio module 1780 may be included in e.g., the input/output interface. The audio module 1780 may process sound information input or output through e.g., a speaker 1782, a receiver 1784, an earphone 1786, or a microphone 1788.

For example, the camera module 1791 may be a device for recording still images and videos, and may include, according to an embodiment of the present disclosure, one or more image sensors (e.g., front and back sensors), a lens, an Image signal processor (ISP), or a flash such as an LED or xenon lamp.

The power manager module 1795 may manage power of the electronic device 1701, for example. According to an embodiment of the present disclosure, the power manager module 1795 may include a power management Integrated circuit (PMIC), a charger IC, or a battery or fuel gauge. The PMIC may have a wired and/or wireless recharging scheme. The wireless charging scheme may include e.g., a magnetic resonance scheme, a magnetic induction scheme, or an electromagnetic wave based scheme, and an additional circuit, such as a coil loop, a resonance circuit, a rectifier, or the like may be added for wireless charging. The battery gauge may measure an amount of remaining power of the battery 1796, a voltage, a current, or a temperature while the battery 1796 is being charged. The battery 1796 may include, e.g., a rechargeable battery or a solar battery.

The indicator 1797 may indicate a particular state of the electronic device 1701 or a part (e.g., the processor 1710) of the electronic device, including e.g., a booting state, a message state, or recharging state. The motor 1798 may convert an electric signal to a mechanical vibration and may generate a vibrational or haptic effect. Although not shown, a processing unit for supporting mobile TV, such as a GPU may be included in the electronic device 1701. The processing unit for supporting mobile TV may process media data conforming to a standard for digital multimedia broadcasting (DMB), digital video broadcasting (DVB), or MediaFlo™.

Each of the aforementioned components of the electronic device may include one or more parts, and a name of the part may vary with a type of the electronic device. The electronic device in accordance with various embodiments of the present disclosure may include at least one of the aforementioned components, omit some of them, or include other additional component(s). Some of the components may be combined into an entity, but the entity may perform the same functions as the components may do.

The term 'module' may refer to a unit including one of hardware, software, and firmware, or a combination thereof. The term 'module' may be interchangeably used with a unit, logic, logical block, component, or circuit. The module may be a minimum unit or part of an integrated component. The module may be a minimum unit or part of performing one or more functions. The module may be implemented mechanically or electronically. For example, the module may include at least one of Application Specific Integrated Circuit (ASIC) chips, Field Programmable Gate Arrays (FPGAs), or Programmable Logic Arrays (PLAs) that perform some operations.

According to an embodiment of the present disclosure, at least a part of the device (e.g., modules or their functions) or method (e.g., operations) may be implemented as instructions stored in a computer-readable storage medium e.g., in the form of a program module. The instructions, when executed by a processor (e.g., the processor 120), may enable the processor to carry out a corresponding function. The computer-readable storage medium may be e.g., the memory 130.

The computer-readable storage medium may include a hardware device, such as hard discs, floppy discs, and magnetic tapes (e.g., a magnetic tape), optical media such as compact disc ROMs (CD-ROMs) and digital versatile discs (DVDs), magneto-optical media such as floptical disks, ROMs, RAMs, flash memories, and/or the like. Examples of the program instructions may include not only machine language codes but also high-level language codes which are executable by various computing means using an interpreter. The aforementioned hardware devices may be configured to operate as one or more software modules to carry out embodiments of the present disclosure, and vice versa.

Modules or programming modules in accordance with various embodiments of the present disclosure may include at least one or more of the aforementioned components, omit some of them, or further include other additional components. Operations performed by modules, programming modules or other components in accordance with various embodiments of the present disclosure may be carried out sequentially, simultaneously, repeatedly, or heuristically. Furthermore, some of the operations may be performed in a different order, or omitted, or include other additional operation(s).

According to an embodiment of the present disclosure, there is provided a storage medium storing instructions configured to, when executed by at least one processor, enable the at least one processor to perform at least one operation, wherein the at least one operation may include determining a first PA operation voltage corresponding to selected output power for the RF signal transmission using at least one of first information and second information stored in a memory of the electronic device, supplying the first PA operation voltage to the PA, and supplying input power corresponding to the selected output power to the PA.

Although the present disclosure has been described with embodiments, various changes and modifications may be suggested to one skilled in the art. It is intended that the present disclosure encompass such changes and modifications as fall within the scope of the appended claims.

What is claimed is:

1. An electronic device comprising:
   a housing;
   an antenna included in the housing or formed as a portion of the housing;
   a power amplifier (PA) electrically connected with the antenna;
   a radio frequency (RF) transmission circuit electrically connected with the PA;
   a processor electrically connected with the RF transmission circuit and the PA; and
   a memory electrically connected with the processor, wherein the memory is configured to store:
   first information regarding a PA operation voltage and input power corresponding to output power of the PA at a first frequency and
   second information regarding a PA operation voltage corresponding to first output power of the PA at a second frequency different from the first frequency, and
   wherein the memory stores instructions that, when executed, enable the processor to:
   select output power of the PA required upon transmission of a signal with the second frequency through the antenna,
   determine a first PA operation voltage corresponding to the selected output power of the PA using at least one of the first information and the second information,
   perform control to supply the determined first PA operation voltage to the PA, and
   perform control to supply input power corresponding to the selected output power of the PA at the second frequency to the PA.

2. The electronic device of claim 1, wherein the memory stores instructions that, when executed, enable the processor to:
   determine whether the selected output power of the PA belongs to a preset output power range, and
   when the selected output power of the PA belongs to the preset output power range, determine the first PA operation voltage corresponding to the selected output power of the PA using the second information.

3. The electronic device of claim 1, wherein the memory stores instructions that, when executed, enable the processor to: when the selected output power of the PA is substantially the same as the first output power, determine that a PA operation voltage corresponding to the first output power included in the second information is the first PA operation voltage.

4. The electronic device of claim 1, wherein the memory stores instructions that, when executed, enable the processor to, when the selected output power is different from the first output power, compute a PA operation voltage corresponding to the selected output power included in the first information and a PA operation voltage corresponding to the selected output power using the second information and determine that the computed PA operation voltage is the first PA operation voltage.

5. The electronic device of claim 4, wherein the memory stores instructions that, when executed, enable the processor to, when the selected output power is larger than the first output power, compute the PA operation voltage using a preset first constant (F1) based on $$V_{22} = V_{12} + \frac{F1 \times V_{12} \times (V_{21} - V_{11})}{V_{11}}$$

wherein, $V_{11}$ is a PA operation voltage at the first frequency corresponding to the first output power, $V_{12}$ is a PA operation voltage at the first frequency corresponding to the selected output power, $V_{21}$ is an adjusted PA operation voltage at the second frequency corresponding to the first output power, and $V_{22}$ is a PA operation voltage at the second frequency corresponding to the selected output power.

6. The electronic device of claim 4, wherein the memory stores instructions enabling the processor to, when the selected output power is smaller than the first output power, compute the PA operation voltage using a preset second constant (F2) based on $$V_{22} = V_{12} + \frac{F2 \times V_{12} \times (V_{21} - V_{11})}{V_{11}}$$

wherein, $V_{11}$ is a PA operation voltage at the first frequency corresponding to the first output power, $V_{12}$ is a PA operation voltage at the first frequency corresponding to the selected output power, $V_{21}$ is an adjusted PA operation voltage at the second frequency corresponding to the first output power, and $V_{22}$ is a PA operation voltage at the second frequency corresponding to the selected output power.

7. The electronic device of claim 1, wherein the memory stores the first information and the second information for each of a plurality of power modes based on a characteristic of the PA.

8. The electronic device of claim 7, wherein the memory stores instructions that, when executed, enable the processor to:
identify a first power mode corresponding to the selected output power among the plurality of power modes, and
determine the first PA operation voltage corresponding to the selected output power using at least one of the first information and the second information corresponding to the first power mode.

9. The electronic device of claim 1, wherein the memory is further configured to store third information regarding input power corresponding to second output power of the PA adjusted based on the first information at the second frequency.

10. The electronic device of claim 9, wherein the memory stores instructions that, when executed, enable the processor to supply input power corresponding to the selected output power determined using the third information to the PA.

11. A method for operating an electronic device for transmission of a radio frequency (RF) signal, the method comprising:

selecting output power of a power amplifier (PA) required upon transmission of a signal with a second frequency through an antenna;
determining a first PA operation voltage corresponding to the selected output power using first information stored in a memory of the electronic device and second information regarding a PA operation voltage corresponding to first output power of the PA at the second frequency;
supplying the determined first PA operation voltage to the PA; and
supplying input power corresponding to the selected output power at the second frequency to the PA,
wherein the first information is information regarding a PA operation voltage and input power corresponding to output power of the PA at a first frequency different from the second frequency.

12. An electronic device, comprising:
a power amplifier (PA) configured to amplify and output a radio frequency (RF) signal;
a memory configured to store first information regarding a PA operation voltage and input power corresponding to output power of the PA at a first frequency and second information regarding a PA operation voltage corresponding to first output power of the PA at a second frequency different from the first frequency; and
a processor configured to determine a first PA operation voltage corresponding to output power selected for transmission of the RF signal using at least one of the first information and the second information, perform control to supply the first PA operation voltage to the PA, and performing control so that input power corresponding to the selected output power is supplied to the PA.

13. The electronic device of claim 12, wherein the processor is configured to: when a frequency for the RF signal transmission is the first frequency, determine that the first PA operation voltage is a PA operation voltage corresponding to the selected output power included in the first information.

14. The electronic device of claim 12, wherein the processor is configured to: when a frequency for the RF signal transmission is the second frequency, determine whether the selected output power belongs to a preset output power range.

15. The electronic device of claim 14, wherein the processor is configured to: when the selected output power belongs to the preset output power range, determine the first PA operation voltage corresponding to the selected output power using at least one of the first information and the second information.

16. The electronic device of claim 12, wherein the processor is configured to: when the selected output power is the same as the first output power, determines that a PA operation voltage corresponding to the first output power included in the second information is the first PA operation voltage.

17. The electronic device of claim 12, wherein the processor is configured to: when the selected output power is different from the first output power, compute a PA operation voltage corresponding to the selected output power included in the first information and a PA operation voltage corresponding to the selected output power using the second information and determine that the computed PA operation voltage is the first PA operation voltage.

18. The electronic device of claim 17, wherein the processor is configured to: when the selected output power is larger than the first output power, compute the PA operation voltage using a preset first constant, and when the selected output power is smaller than the first output power, compute the PA operation voltage using a preset second constant.

19. The electronic device of claim 12, wherein the memory is further configured to store third information regarding input power corresponding to second output power of the PA adjusted based on the first information at the second frequency.

20. The electronic device of claim 19, wherein the processor is further configured to perform control to supply input power corresponding to the selected output power determined using the third information to the PA.

* * * * *